(12) United States Patent (10) Patent No.: US 11,800,715 B2
Ikedo (45) Date of Patent: Oct. 24, 2023

(54) SEMICONDUCTOR STORAGE DEVICE

(71) Applicant: Kioxia Corporation, Tokyo (JP)

(72) Inventor: Akihito Ikedo, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 85 days.

(21) Appl. No.: 17/460,870

(22) Filed: Aug. 30, 2021

(65) Prior Publication Data

US 2022/0310645 A1 Sep. 29, 2022

(30) Foreign Application Priority Data

Mar. 23, 2021 (JP) ................. 2021-049093

(51) Int. Cl.
*H10B 43/27* (2023.01)
*H10B 43/10* (2023.01)
*H10B 43/35* (2023.01)

(52) U.S. Cl.
CPC ............. *H10B 43/27* (2023.02); *H10B 43/10* (2023.02); *H10B 43/35* (2023.02)

(58) Field of Classification Search
CPC ........... H01L 2924/1451; H01L 27/115; H01L 27/1157; H01L 27/11582; H01L 27/11565; H10B 41/00–70; H10B 43/00–50
See application file for complete search history.

(56) References Cited

U.S. PATENT DOCUMENTS

| | | | |
|---|---|---|---|
| 9,412,749 B1 * | 8/2016 | Shimabukuro | H10B 41/35 |
| 11,276,698 B2 * | 3/2022 | Chang | H01L 29/7926 |
| 2013/0083601 A1 * | 4/2013 | Liu | H10B 41/30 |
| | | | 365/185.17 |
| 2015/0371993 A1 * | 12/2015 | Jung | H01L 23/528 |
| | | | 257/773 |
| 2017/0278851 A1 * | 9/2017 | Fujii | H01L 28/00 |
| 2017/0301687 A1 * | 10/2017 | Takahashi | H01L 27/11565 |
| 2019/0296117 A1 * | 9/2019 | Ishiduki | H10B 43/10 |
| 2019/0326310 A1 * | 10/2019 | Fukuzumi | H01L 27/11565 |
| 2020/0066749 A1 * | 2/2020 | Yamasaki | H01L 27/11582 |
| 2020/0075623 A1 * | 3/2020 | Ito | H01L 23/53295 |
| 2020/0295016 A1 * | 9/2020 | Harada | H01L 27/11565 |
| 2020/0295036 A1 * | 9/2020 | Sotome | H01L 27/1157 |
| 2020/0303402 A1 * | 9/2020 | Kobayashi | H01L 27/1157 |

* cited by examiner

*Primary Examiner* — Eric A. Ward
*Assistant Examiner* — Zachary Taylor Nix
(74) *Attorney, Agent, or Firm* — Foley & Lardner LLP

(57) ABSTRACT

A semiconductor storage device includes: a substrate layer; and a stacked body that is provided on the substrate layer. The semiconductor storage device includes a columnar portion that includes a semiconductor body extending within the stacked body in a stacking direction. The semiconductor storage device includes: an insulating layer provided on the plurality of terrace portions; and a plurality of columnar bodies extending in a first direction and provided within the insulating layer. The semiconductor storage device includes slit portions that split the stacked body into a plurality of string units. Each of the columnar bodies adjacent to each of the slit portions has a core film, the semiconductor body, a tunnel insulating film, and a block insulating film formed in sequence from a shaft center side to an outer periphery side of the columnar body, and the columnar body does not have the charge storage portion.

16 Claims, 19 Drawing Sheets

SEMICONDUCTOR STORAGE DEVICE

CROSS-REFERENCE TO RELATED APPLICATION

This application is based upon and claims the benefit of priority from Japanese Patent Application No. 2021-049093, filed Mar. 23, 2021, the entire contents of which are incorporated herein by reference.

FIELD

Embodiments described herein relate generally to a semiconductor storage device.

BACKGROUND

To connect a plurality of electrode layers to a control circuit in a three-dimensional memory device, a staircase contact structure of the plurality of electrode layers is proposed. In addition, a method of manufacturing a three-dimensional memory device including forming a stacked body having a plurality of sacrificial layers and a plurality of insulating layers, subsequently forming cavities by removing the sacrificial layers, and forming interconnection layers in the cavities is proposed. The stacked body including the cavities is supported by columnar bodies formed in the stacked body before removal of the sacrificial layers. In the three-dimensional memory device, the stacked body is demarcated into a plurality of blocks via separation portions, and interconnection portions are provided in the separation portions.

Setting a small distance between each separation portion and each columnar body as a result of high integration of the three-dimensional memory device is considered to generate a structure in which the separation portion and the columnar body interfere with each other.

With this structure, there is a risk of replacement of part of materials for the columnar body through a separation portion formation slit at a time of forming interconnection layers, and of causing leakage in the interconnections proximate to the columnar body.

DETAILED DESCRIPTION

Figure 1:
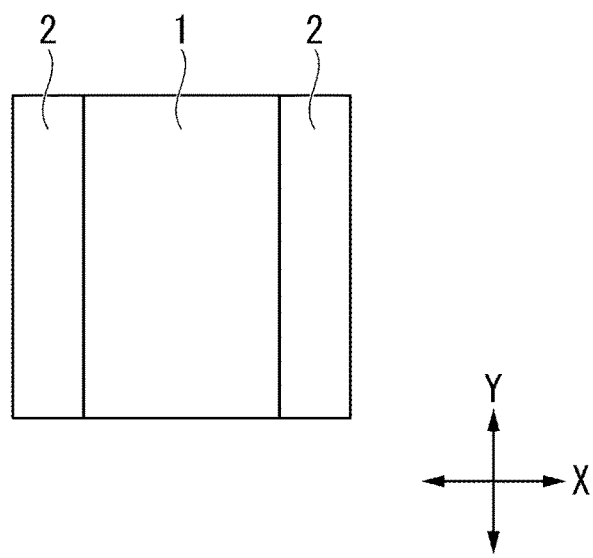
FIG. 1 is a schematic plan block diagram of a semiconductor storage device according to at least one embodiment.

Embodiments provide a semiconductor storage device capable of preventing interconnection leakage.

In general, according to at least one embodiment, a semiconductor storage device includes a substrate layer. The semiconductor storage device according to at least one embodiment includes a stacked body that is provided on the substrate layer and that includes a plurality of electrode layers stacked in a first direction via insulators, the stacked body including staircase portions in which the plurality of electrode layers include a plurality of terrace portions forming level difference portions and aligned in a staircase fashion. The semiconductor storage device according to at least one embodiment includes a columnar portion that includes a semiconductor body extending within the stacked body in the first direction and a charge storage portion provided between the semiconductor body and the electrode layers. The semiconductor storage device according to at least one embodiment includes: an insulating layer provided on the plurality of terrace portions; and a plurality of columnar bodies extending in the first direction and provided within the insulating layer. The semiconductor storage device according to at least one embodiment includes slit portions that extend in the first direction and a second direction crossing the first direction and parallel to the substrate layer, that are provided in the stacked body at predetermined intervals in a third direction crossing the first direction and the second direction, and that split the stacked body into a plurality of string units. Each of the columnar bodies adjacent to each of the slit portions has a core film, the semiconductor body, a tunnel insulating film, and a block insulating film formed in sequence from a shaft center side to an outer periphery side of the columnar body, and does not have the charge storage portion between the tunnel insulating film and the block insulating film.

First Embodiment

A semiconductor storage device according to a first embodiment will be described hereinafter with reference to the drawings.

In the following descriptions, configurations having same or similar functions are denoted by the same reference signs. In addition, repetitive descriptions of those configurations are often omitted. In the present specification, "connection" is not limited to a case of physical connection and includes a case of electrical connection. In the present specification, "adjacent" is not limited to a case of being adjacent to each other and includes a case of presence of another element between two target elements. In the present specification, "xx is provided on yy" is not limited to a case where xx comes in contact with yy and includes a case where another member lies between xx and yy. In the present specification, "parallel" and "orthogonal" also include cases of "generally parallel" and "generally orthogonal", respectively.

Furthermore, an X direction, a Y direction, and a Z direction will be defined first. The X direction and the Y direction are directions along a front surface of a substrate 10 to be described later. The X direction is the direction in which word lines WL, to be described later, extend. The Y direction is the direction crossing, e.g., orthogonal to the X direction. The Y direction is the direction in which bit lines BL, to be described later, extend. The Z direction (first direction) is a direction crossing, e.g., orthogonal to the X direction (second direction) and the Y direction (third direction) and is a thickness direction of the substrate 10. In the present specification, a "+Z direction" is often referred to as "upward", and a "−Z direction" is often referred to as "downward". The +Z direction and the −Z direction differ by 180°. It is to be noted, however, that these expressions are given for the sake of convenience and do not specify a gravity direction.

<Overall Configurations of Semiconductor Storage Device>

FIG. 1 is a schematic plan block diagram of a semiconductor storage device according to at least one embodiment.

Figure 2:
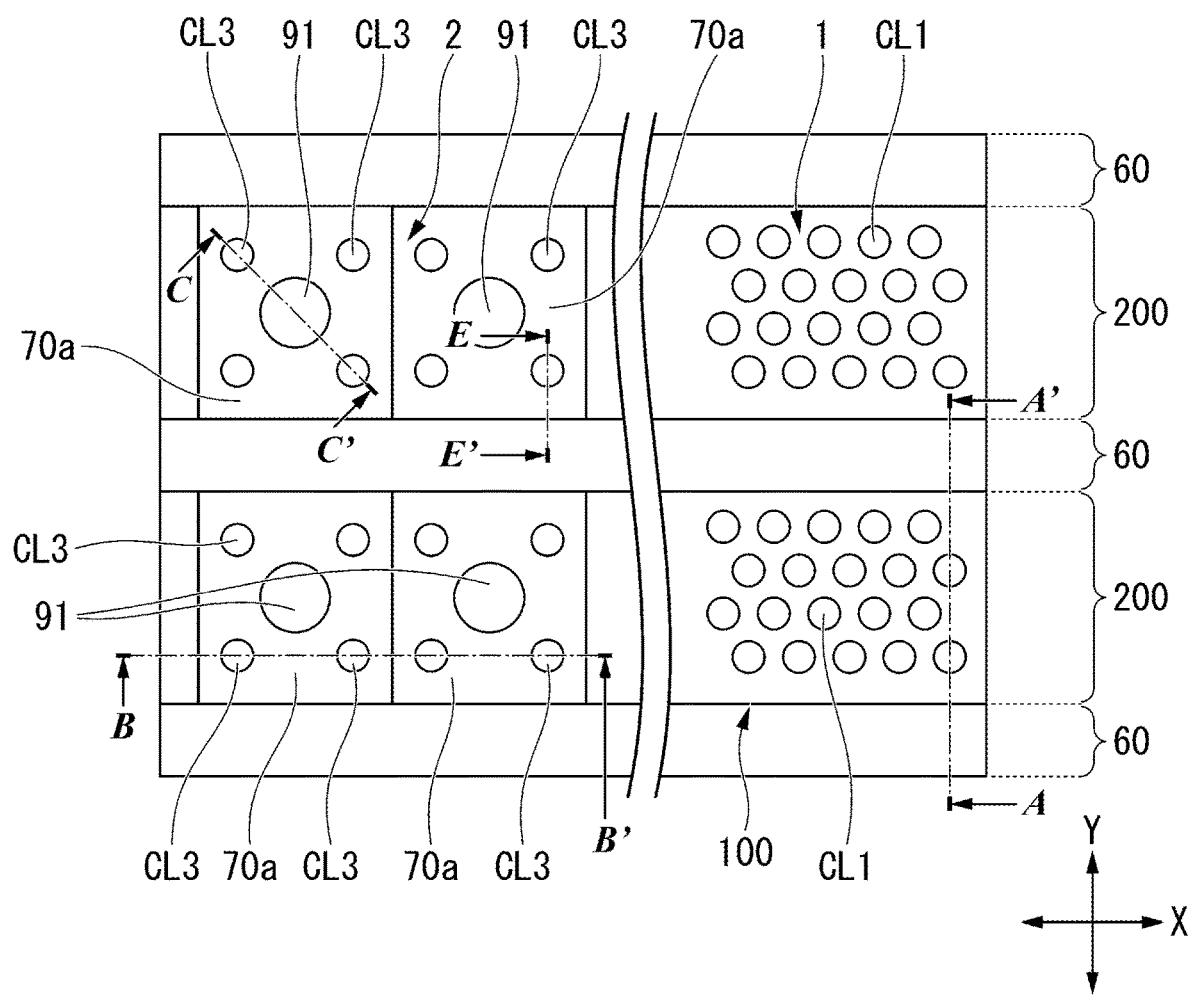
FIG. 2 is a schematic plan view showing a cell array region and a staircase region in the semiconductor storage device according to at least one embodiment.

FIG. 2 is a schematic plan view of the semiconductor storage device according to at least one embodiment.

The semiconductor storage device according to the embodiment has a memory cell array 1 and staircase portions 2 provided in peripheral regions outside of the memory cell array 1. The memory cell array 1 and the staircase portions 2 are provided on the same substrate.

Figure 3:
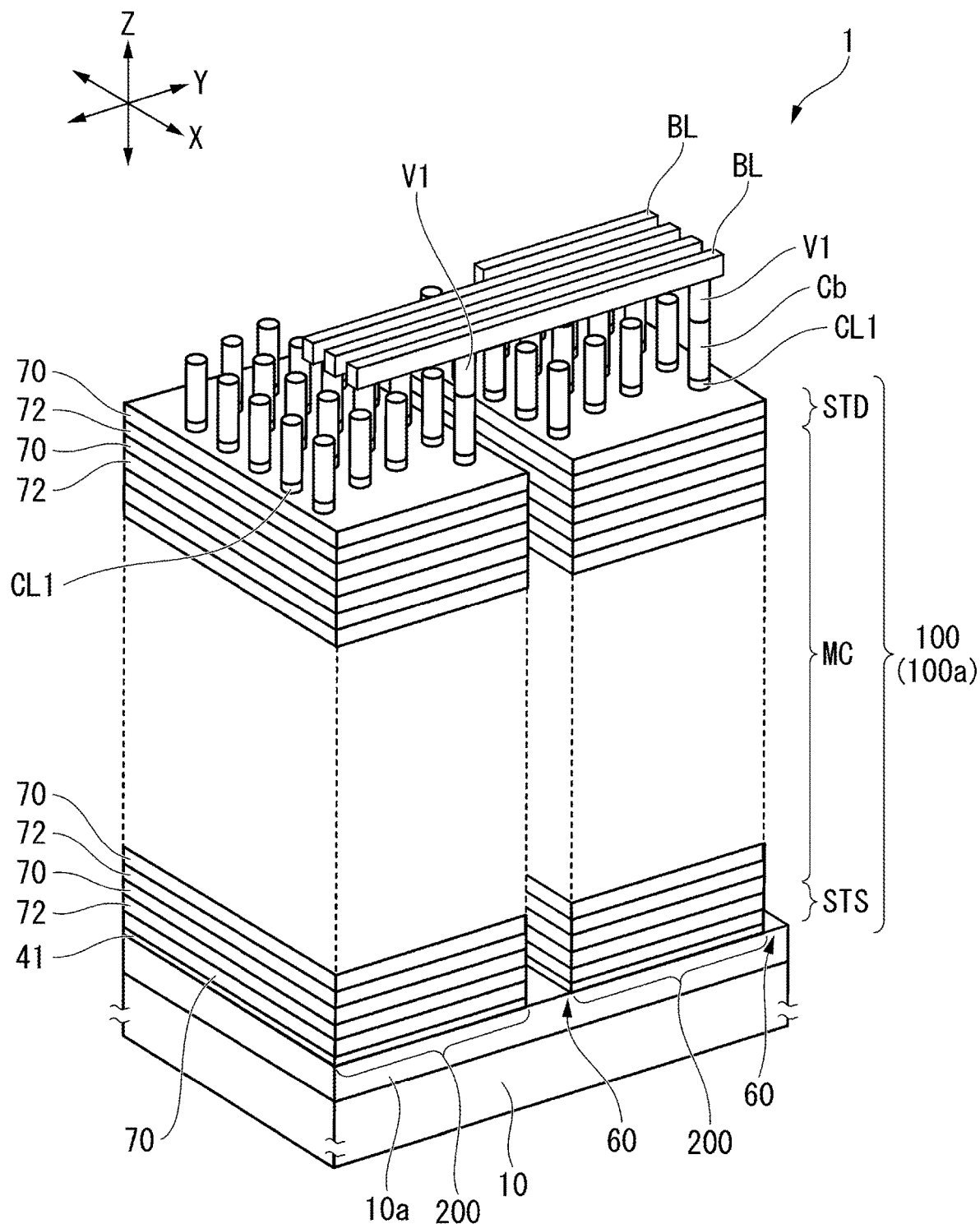
FIG. 3 is a schematic perspective view of a memory cell array in the semiconductor storage device according to the embodiment.

FIG. 3 is a schematic perspective view of the memory cell array 1 according to at least one embodiment.

Figure 4:
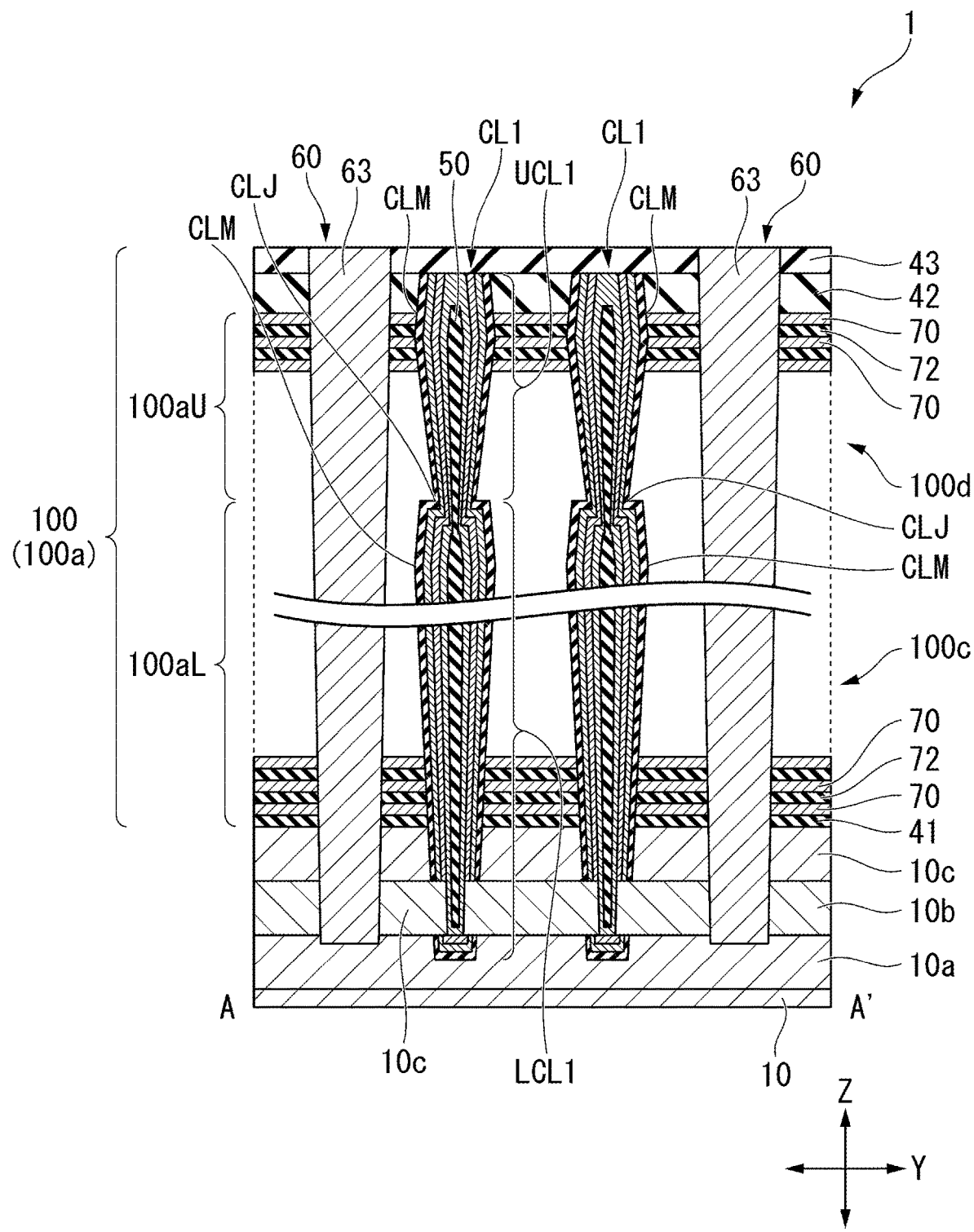
FIG. 4 is a cross-sectional view taken along A-A' of FIG. 2.

FIG. 4 is a cross-sectional view taken along A-A' of FIG. 2.

FIG. 3 shows the X direction, the Y direction, and the Z direction, and the X direction, the Y direction, and the Z direction shown in the other drawings correspond to the X direction, the Y direction, and the Z direction shown in FIG. 3, respectively.

The memory cell array 1 has the substrate 10, a stacked body 100, a plurality of columnar portions CL1, a plurality of slit portions 60, and upper layer interconnections provided above the stacked body 100. FIG. 3 shows, for example, bit lines BL as the upper layer interconnections.

The substrate 10 and the stacked body 100 are provided in a cell array region where the memory cell array 1 is provided and in staircase regions where the staircase (stepped) portions 2 are provided. As for the stacked body 100, a part provided in the cell array region is denoted by "first stacked portion 100a" (refer to FIGS. 3, 4, and the like) and a part provided in each staircase region is denoted by "second stacked portion 100b" (refer to FIGS. 6, 7, and the like).

As shown in FIGS. 2 to 4, the plurality of columnar portions CL1 are disposed in the cell array region. The columnar portions CL1 are each formed into a generally cylindrical column shape extending within the first stacked portion 100a in a stacking direction (Z direction) of the first stacked portion 100a.

As shown in FIG. 2, the plurality of columnar portions CL1 are arranged, for example, in staggered arrangement. Alternatively, the plurality of columnar portions CL1 may be arranged in a square grid pattern along the X direction and the Y direction.

As shown in FIG. 2, the slit portions 60 extend within the cell array region and the staircase regions in the X direction and split the stacked body 100 into a plurality of string units 200 in the Y direction. Each of the string units 200 has the cell array region and the staircase regions.

As shown in FIG. 3, the plurality of bit lines BL are provided above the first stacked portion 100a. The plurality of bit lines BL are, for example, a metal film extending in the Y direction. The plurality of bit lines BL separate from one another in the X direction.

An upper end of a semiconductor body 20, to be described later, in each columnar portion CL1 is connected to one bit line BL via a contact Cb and a contact V1 shown in FIG. 3.

The plurality of columnar portions CL1 are connected to one common bit line BL. The plurality of columnar portions CL1 connected to the common bit line BL include the columnar portions CL1 each selected from each of the string units 200 into which the stacked body 100 is split by the slit portions 60 in the Y direction.

As shown in FIG. 4, the first stacked portion 100a has a plurality of electrode layers 70 stacked on the substrate 10. The plurality of electrode layers 70 are stacked in the direction (Z direction) perpendicular to a principal surface of the substrate 10 via insulating layers 72. The electrode layers 70 are metal layers. The electrode layers 70 are, for example, tungsten layers that contain tungsten as a main component, or molybdenum layers that contain molybdenum as a main component. The insulating layers 72 are silicon oxide layers that contain silicon oxide as a main component.

While FIGS. 3 and 4 illustrate the first stacked portion 100a as a simple stacked structure of the electrode layers 70 and the insulating layers 72, the first stacked portion 100a employs, to be exact, a structure in which a plurality of hierarchies are stacked vertically for achievement of an increase in the number of stacks of the semiconductor storage device.

In an example shown in FIGS. 3 and 4, the first stacked portion 100a has a hierarchical structure having two hierarchies including a lower layer portion 100aL and an upper layer portion 100aU.

The lower layer portion 100aL configures a lower stacked body 100c by the stacked structure of the electrode layers 70 and the insulating layers 72. Lower layer columnar portions LCL1 that penetrate the lower stacked body 100c in the first direction (Z direction) are provided in the lower stacked body 100c.

The upper layer portion 100aU configures an upper stacked body 100d by the stacked structure of the electrode layers 70 and the insulating layers 72. Upper layer columnar portions UCL1 that penetrate the upper stacked body 100d in the first direction (Z direction) are provided in the upper stacked body 100d.

Therefore, to be exact, each columnar portion CL1 is a structure of stacking one lower layer columnar portion LCL1 and one upper layer columnar portion UCL1, and a joint portion CLJ is formed in a boundary portion between the lower layer columnar portion LCL1 and the upper layer columnar portion UCL1.

The lower layer columnar portions LCL1 and the upper layer columnar portions UCL1 are each formed into a columnar shape such that a diameter is smaller on a side closer to the substrate 10 and gradually increases in the direction (Z direction) away from the substrate 10. A large-diameter portion CLM is formed on a side slightly lower than an uppermost portion, i.e., closer to the substrate 10 in each of the lower layer columnar portions LCL1 and the upper layer columnar portions UCL1. The lower layer columnar portions LCL1 and the upper layer columnar portions UCL1 are each formed into the columnar shape such that the diameter of an upper side than the large-diameter portion CLM gradually decreases.

It is noted that in the following descriptions, the columnar portion CL1 of the stacked structure of the lower layer columnar portion LCL1 and the upper layer columnar portion UCL1 is simply denoted by the "columnar portion CL1" and the columnar portion CL1 is used in the descriptions when functions and the structure can be described as those of one columnar portion CL1.

The substrate 10 is, for example, a silicon substrate, and a semiconductor layer 10a, a source line 10b, and a semiconductor layer 10c are stacked on an upper surface side of the substrate 10. A bottom portion side of each lower layer columnar portion LCL1 is buried in the semiconductor layer 10a, the source line 10b, and the semiconductor layer 10c.

The semiconductor layers 10a and 10c are formed from n-type silicon obtained by doping a semiconductor such as silicon with impurities as a conductive material. As an example, the semiconductor layers 10a and 10c are formed from phosphorus-doped polysilicon. Part of films in a lower end portion of each lower layer columnar portion LCL1 are removed, as described later, and the lower end portion is connected to the source line 10b. The source line 10b is formed from a conductive layer of W, WSi, or the like.

An insulating layer 41 is provided on an upper surface of the semiconductor layer 10c. The lowermost electrode layer 70 is provided on the insulating layer 41. An insulating layer 42 is provided on the uppermost electrode layer 70 and an insulating layer 43 is provided on the insulating layer 42. The insulating layer 43 covers an upper end of each columnar portion CL1.

Figure 5A:
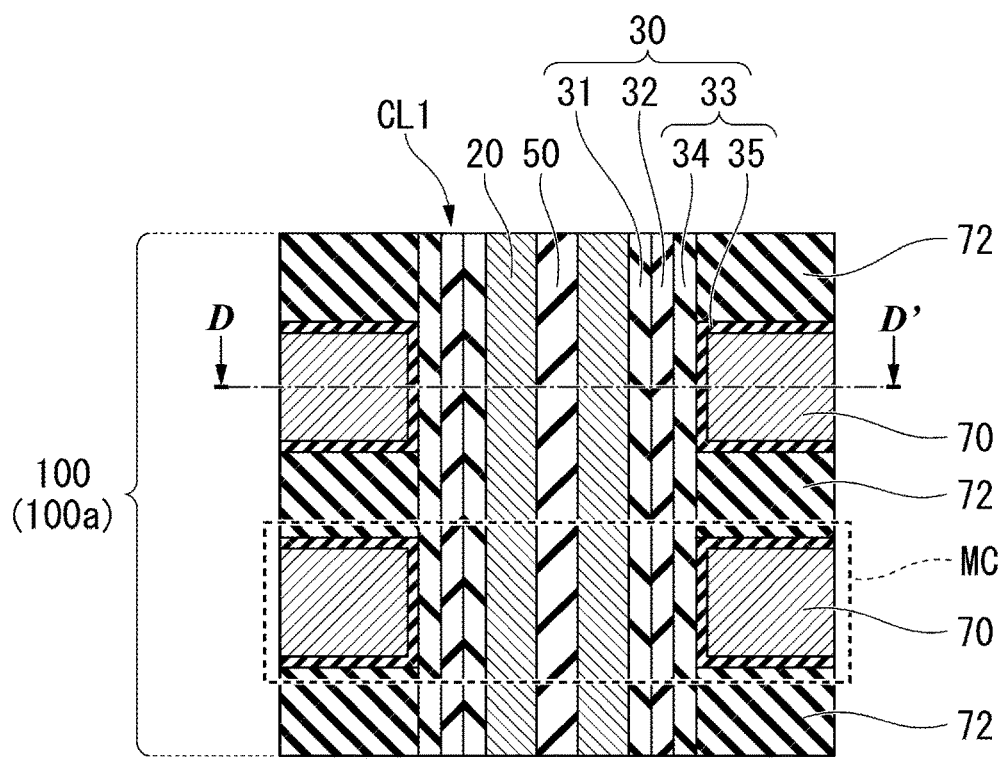
FIG. 5A is a partial enlarged cross-sectional view of FIG. 4.

FIG. 5A is an enlarged cross-sectional view showing portions of the first stacked portion 100a shown in FIG. 4.

Figure 5B:
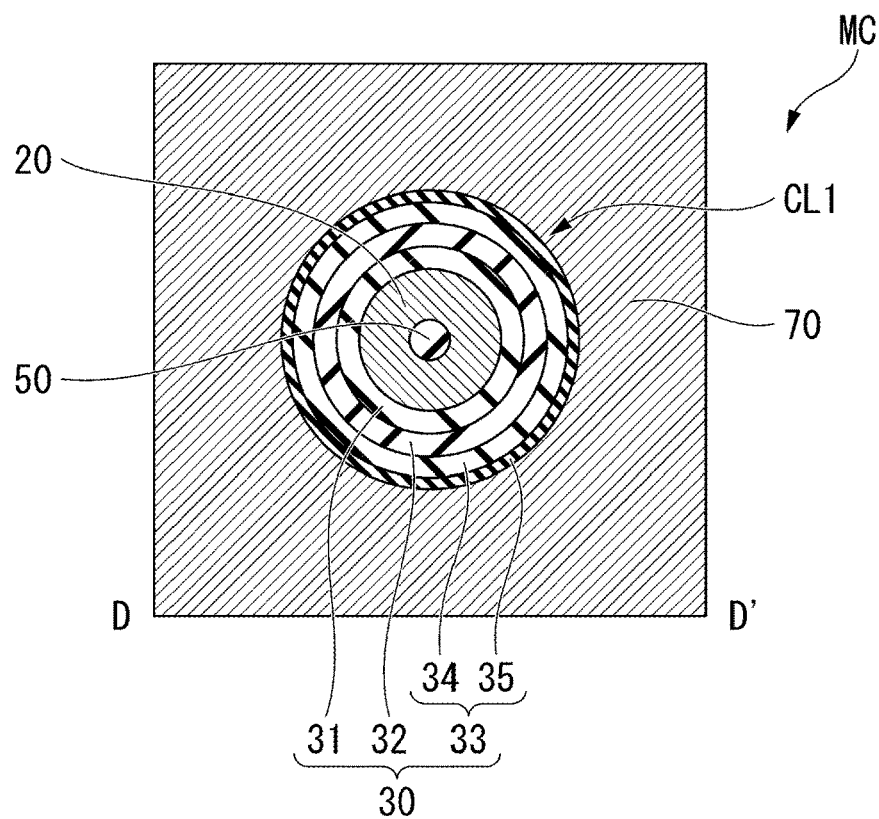
FIG. 5B is a cross-sectional view taken along D-D' of FIG. 5A.

FIG. 5B is a cross-sectional view taken along D-D' of FIG. 5A.

The columnar portion CL1 has a stacked film (memory film) 30, a semiconductor body 20, and an insulating core film 50.

The semiconductor body 20 continuously extends within the first stacked portion 100a in the stacking direction (Z direction) in a pipe shape. The stacked film 30 is provided between the electrode layers 70 and the semiconductor body 20 and surrounds the semiconductor body 20 from an outer periphery side. The core film 50 is provided inward of the pipe-shaped semiconductor body 20. An upper end side of the semiconductor body 20 is connected to one bit line BL via the contact Cb and the contact V1 shown in FIG. 3.

The stacked film 30 has a tunnel insulating film 31, a charge storage film (charge storage portion) 32, and a block insulating film 33. The tunnel insulating film 31, the charge storage film 32, and the block insulating film 33 are provided between the semiconductor body 20 and the electrode layers 70 in sequence from the semiconductor body 20 side. The charge storage film 32 is provided between the tunnel insulating film 31 and the block insulating film 33. In the columnar portion CL1, the core film 50, the semiconductor body 20, the tunnel insulating film 31, the charge storage film 32, and the block insulating film 33 are disposed in sequence from a shaft center side to an outer periphery side thereof.

The tunnel insulating film 31, the charge storage film 32, and the block insulating film 33 are partially removed on a lower end portion side of the semiconductor body 20 in a region in contact with the source line 10b. Part of a side surface of the semiconductor body 20 is thereby directly connected to the source line 10b.

The semiconductor body 20, the stacked film 30, and one electrode layer 70 configure a memory cell MC. The memory cell MC has a vertical transistor structure in which the electrode layer 70 surrounds the semiconductor body 20 via the stacked film 30.

In each memory cell MC of the vertical transistor structure, the semiconductor body 20 functions as, for example, a silicon channel body and the electrode layer 70 functions as, for example, a control gate. The charge storage film 32 functions as, for example, a data storage layer that stores electric charges injected from the semiconductor body 20.

The semiconductor storage device according to at least one embodiment is a nonvolatile semiconductor storage device capable of electrically and freely erasing and writing data and retaining a storage content even after power off.

The memory cell MC is, for example, a charge trap type memory cell. The charge storage film 32 has many trap sites trapping electric charges in the insulating film and examples of the charge storage film 32 include a silicon nitride film. Alternatively, the charge storage film 32 may be a conductive floating gate surrounded by an insulator.

The tunnel insulating film 31 serves as a potential barrier when electric charges are injected into the charge storage film 32 from the semiconductor body 20 or when electric charges accumulated in the charge storage film 32 are emitted to the semiconductor body 20. Examples of the tunnel insulating film 31 include a silicon oxide film.

The block insulating film 33 prevents emission of the electric charges accumulated in the charge storage film 32 to the electrode layer 70. The block insulating film 33 also prevents back-tunneling of the electric charges from the electrode layer 70 to the columnar portion CL1.

The block insulating film 33 has a first block film 34 and a second block film 35. The first block film 34 is, for example, a silicon oxide film. The second block film 35 is a metal oxide film higher in dielectric constant than the silicon oxide film. Examples of this metal oxide film include an aluminum oxide film, a zirconium oxide film, and a hafnium oxide film.

The first block film 34 is provided between the charge storage film 32 and the second block film 35. The second block film 35 is provided between the first block film 34 and the electrode layer 70.

The second block film 35 is also provided between the electrode layer 70 and the insulating layer 72. The second block film 35 is formed continuously along upper and lower surfaces of the electrode layer 70 and a side surface, which is closer to the stacked film 30, of the electrode layer 70. The second block film 35 is provided separately without being provided continuously in the stacking direction of the first stacked portion 100*a*.

Alternatively, the second block film 35 may be formed continuously along the stacking direction of the first stacked portion 100*a* without being formed between the electrode layer 70 and the insulating layer 72. In another alternative, the block insulating film 33 may be a single layer film continuous along the stacking direction of the first stacked portion 100*a*.

Moreover, a metal nitride film may be formed either between the second block film 35 and the electrode layer 70 or between the insulating layer 72 and the electrode layer 70. This metal nitride film is, for example, a titanium nitride film and can function as a seed metal for a barrier metal, an adhesion layer, and the electrode layers 70.

As shown in FIG. 3, a drain-side select transistor STD is provided in an upper layer portion of the first stacked portion 100*a*, i.e., upper end portions of the columnar portions CL1. A source-side select transistors STS is provided in a lower layer portion of the first stacked portion 100*a*, i.e., lower end portions of the columnar portions CL1. At least the uppermost electrode layer 70 functions as a control gate of the drain-side select transistor STD. At least the lowermost electrode layer 70 functions as a control gate of the source-side select transistor STS.

A plurality of memory cells MC are provided between the drain-side select transistor STD and the source-side select transistor STS. The plurality of memory cells MCs, the drain-side select transistor STD, and the source-side select transistor STS are connected in series through the semiconductor body 20 in each columnar portion CL1, and configure one memory string. Such memory strings are disposed in a plane direction parallel to an XY plane in, for example, staggered arrangement, and a plurality of memory cells MC are provided in three dimensions in the X direction, the Y direction, and the Z direction.

Next, the slit portions (separation portions) 60 will be described.

As shown in FIG. 4, each slit portion 60 has an insulating film 63. It is noted that FIG. 3 does not show the insulating film 63.

The insulating film 63 spreads in the X direction and the Z direction. As shown in, for example, FIG. 4, the insulating film 63 extends in the Z direction to be adjacent to the first stacked portion 100*a* and reaches an upper portion side of the semiconductor layer 10*a*.

As previously described, the lower end portion of the semiconductor body 20 in the columnar portion CL1 shown in FIG. 4 comes in contact with the semiconductor layer 10*a* of the substrate 10. The source line 10*b* is provided on the semiconductor layer 10*a*.

A data write operation and a data read operation are performed collectively on the transistors of the memory cells MC connected to any one of the word lines WL in any one of the string units 200.

Next, a structure of each staircase region where the staircase portion 2 is provided will be described.

Figure 6:
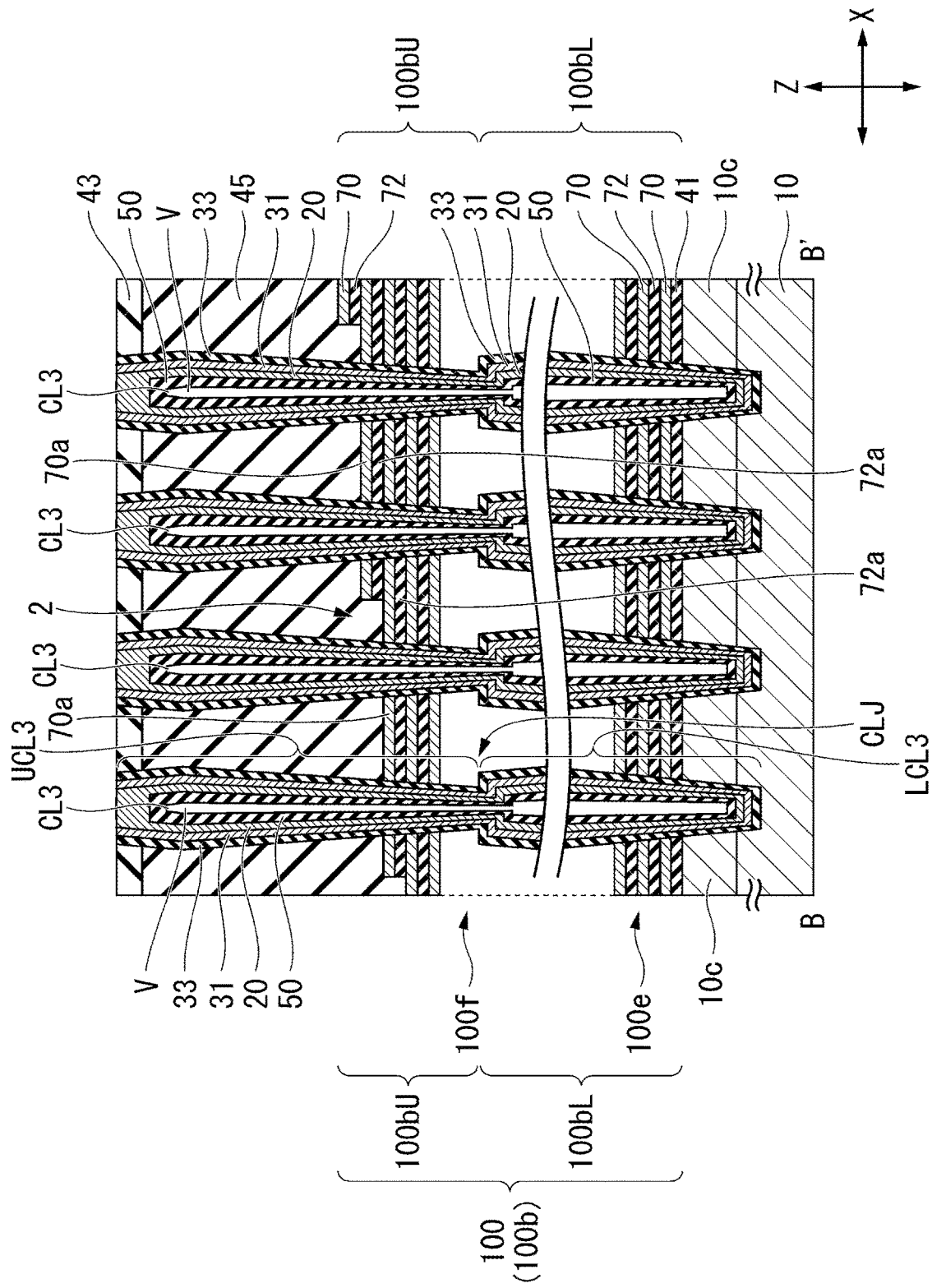
FIG. 6 is a cross-sectional view taken along B-B' of FIG. 2.

FIG. 6 is a cross-sectional view taken along B-B' of FIG. 2.

Figure 7:
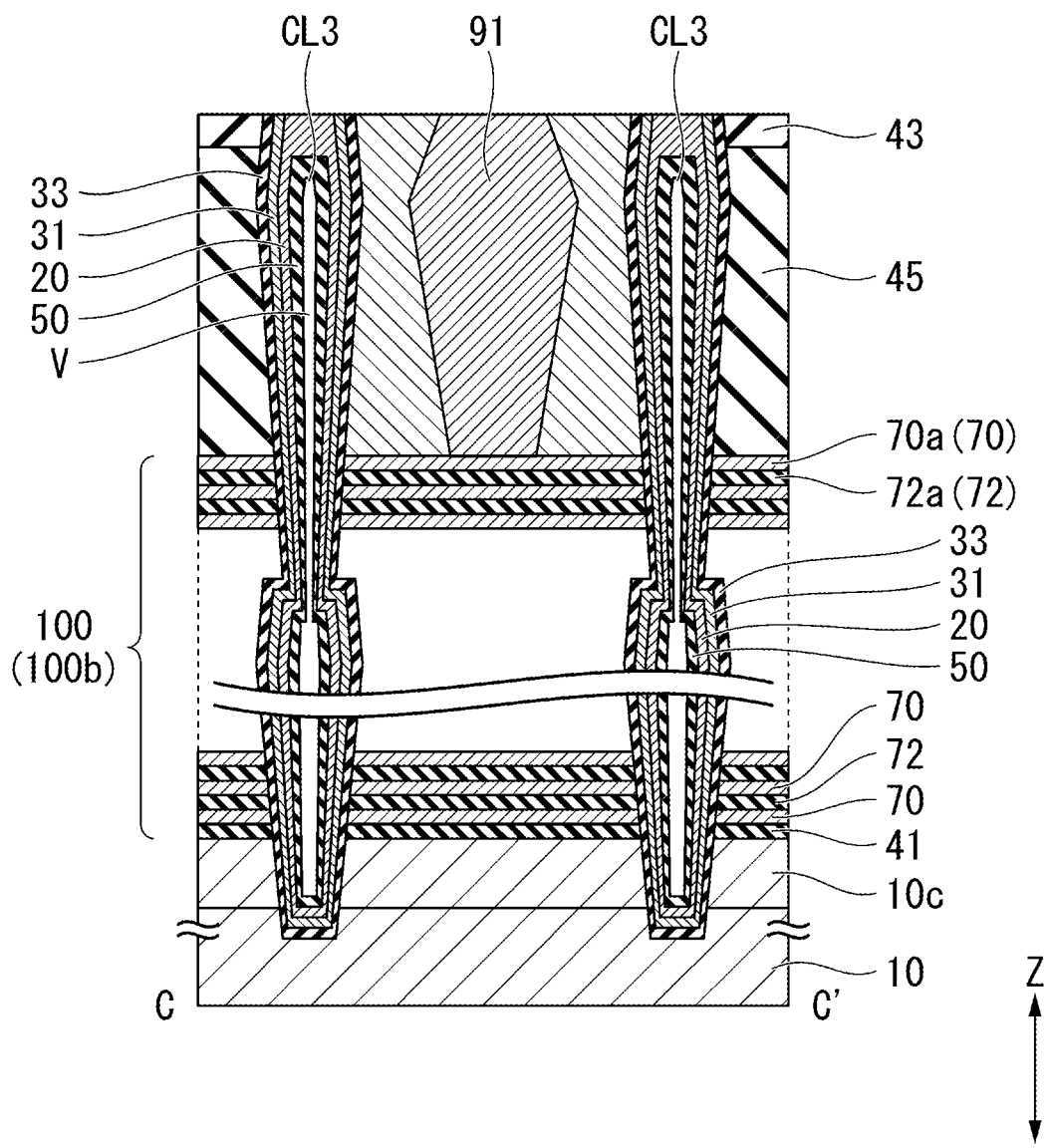
FIG. 7 is a cross-sectional view taken along C-C' of FIG. 2.

FIG. 7 is a cross-sectional view taken along C-C' of FIG. 2.

The stacked body 100 and the slit portions 60 extend from the cell array region to the staircase regions in the X direction. As shown in FIG. 2, in each staircase region, the slit portions 60 split the second stacked portion 100*b* of the staircase portion 2 into the plurality of string units 200 in the Y direction.

As shown in FIG. 6, a plurality of electrode layers 70 in the second stacked portion 100*b* have a plurality of terrace portions 70*a* forming level difference portions along the X direction and aligned in a staircase fashion. The plurality of terrace portions 70*a* form one staircase portion 2. Above the terrace portions 70*a*, all of the upper electrode layers 70 and the upper insulating layers 72 are removed and not left, and the upper electrode layer 70 is not superimposed on each of the electrode layers 70 above the terrace portions 70*a*.

Part of the plurality of insulating layers 72 in the second stacked portion 100*b* are similarly worked into a staircase shape, and the plurality of insulating layers 72 have a plurality of terrace portions 72*a* forming level difference portions along the X direction and aligned in a staircase fashion. The terrace portions 70*a* of the electrode layers 70 are stacked on the terrace portions 72*a* of the insulating layers 72.

An insulating layer 45 is provided on each staircase portion 2. The insulating layer 45 buries the level difference portions of the staircase portion 2 and either eliminates or mitigates a level difference between the second stacked portion 100*b* and the first stacked portion 100*a*. The insulating layer 45 is a silicon oxide layer that contains silicon oxide as a main component.

The insulating layer 43 is provided on the insulating layer 45. The insulating layer 43 is identical to the insulating layer 45 and is, for example, a silicon oxide layer.

A plurality of columnar bodies CL3 extending in the stacking direction (Z direction) of the stacked body 100 are provided within the insulating layer 45 and within the second stacked portion 100*b* under the insulating layer 45. All of the upper electrode layers 70 and the upper insulating layers 72 are removed above the terrace portions 70*a* of the electrode layers 70 in the second stacked portion 100*b*. Owing to this, side surfaces of portions of the columnar bodies CL3 extending within the insulating layer 45 out of side surfaces of the columnar bodies CL3 do not come in contact with the upper electrode layers 70 and are apart from the electrode layers 70.

As shown in FIG. 2, at least one columnar body CL3 is disposed in one terrace portion 70*a*. In an example shown in FIG. 2, four columnar bodies CL3, for example, are disposed in one terrace portion 70*a*.

Figure 14:
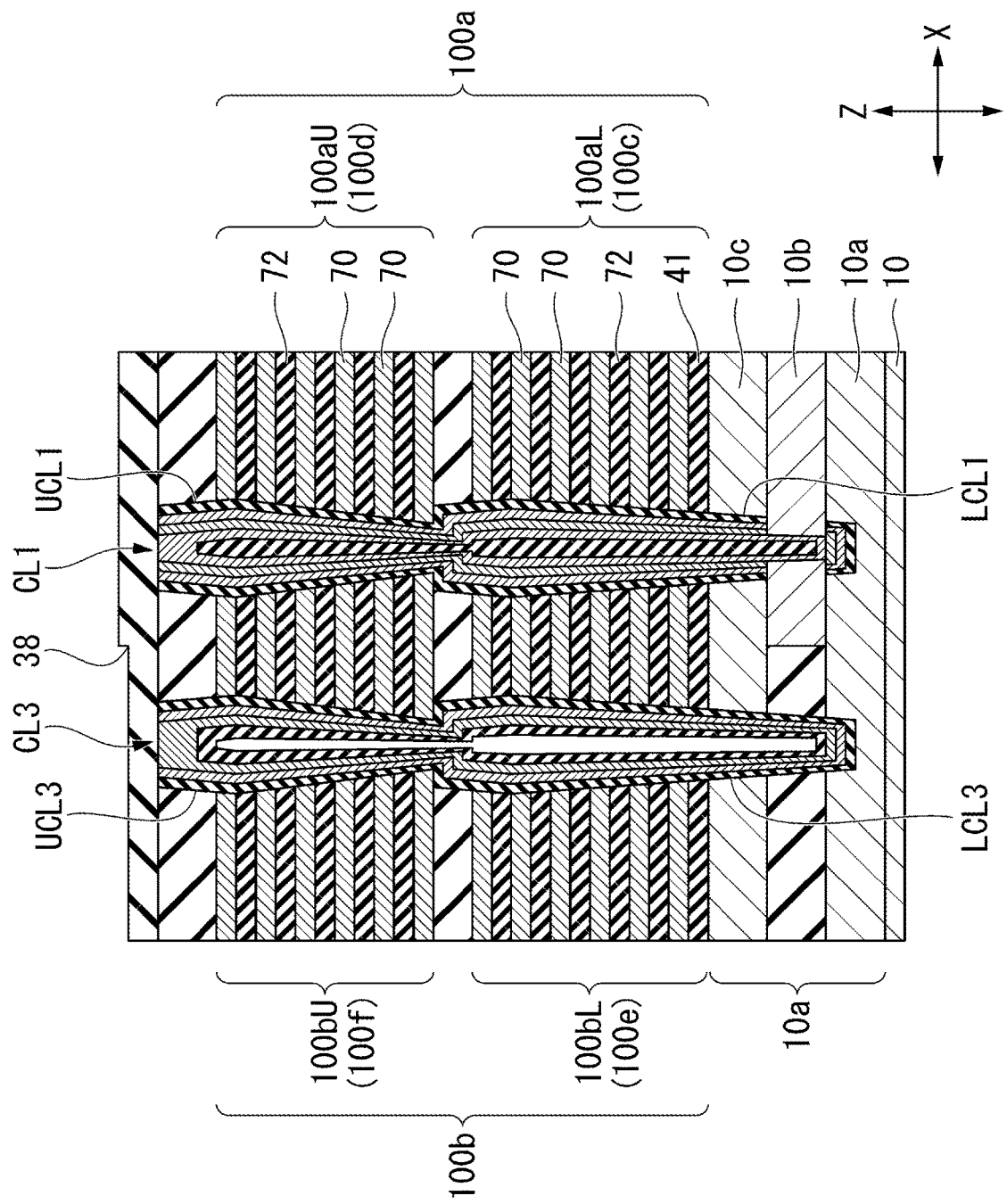
FIG. 14 is a partial cross-sectional view showing a state in which the columnar portion having the block insulating film, the charge storage film, the tunnel insulating film, the semiconductor body, and the core film is formed in the memory hole, and in which the columnar body having the block insulating film, the tunnel insulating film, the semiconductor body, the core film, and a cavity is formed in the staircase region hole.

In at least one embodiment, the second stacked portion 100b has a hierarchical structure having two hierarchies including a lower layer portion 100bL and an upper layer portion 100bU, as shown in FIG. 14 in detail used to describe a manufacturing method to be described later.

The lower layer portion 100bL has a lower stacked body 100e by a repetitive structure of the electrode layers 70 and the insulating layers 72. Lower layer columnar bodies LCL3 penetrating the lower stacked body 100e in the first direction (Z direction) are provided.

The upper layer portion 100bU has an upper stacked body 100f by a repetitive structure of the electrode layers 70 and the insulating layers 72. Upper layer columnar bodies UCL3 penetrating the upper stacked body 100f and the insulating layer 45 above the upper stacked body 100f in the first direction (Z direction) are provided. In at least one embodiment, each columnar body CL3 is a structure of stacking one lower layer columnar body LCL3 and one upper layer columnar body UCL3, and the joint portion CLJ is formed in a boundary portion between the lower layer columnar body LCL3 and the upper layer columnar body UCL3.

Each columnar body CL3 has a similar structure to the structure of the columnar portion CL1 described previously.

Each of the lower layer columnar body LCL3 and the upper layer columnar body UCL3 is generally cylindrical column shaped. The columnar body CL3 differs from the columnar portion CL1 in that the charge storage film 32 is not formed as a film belonging to a plurality of films configuring each of the lower layer columnar body LCL3 and the upper layer columnar body UCL3.

That is, in each of the lower layer columnar body LCL3 and the upper layer columnar body UCL3, a void portion V, the core film 50, the semiconductor body 20, the tunnel insulating film 31, and the block insulating film 33 are disposed in sequence from a shaft center side to an outer periphery side thereof.

The core film 50, the semiconductor body 20, the tunnel insulating film 31, and the block insulating film 33 that configure the lower layer columnar body LCL3 are formed from equivalent materials to the materials of the core film 50, the semiconductor body 20, the tunnel insulating film 31, and the block insulating film 33 that configure the lower layer columnar portion LCL1, respectively.

The core film 50, the semiconductor body 20, the tunnel insulating film 31, and the block insulating film 33 that configure the upper layer columnar body UCL3 are formed from equivalent materials to the materials of the core film 50, the semiconductor body 20, the tunnel insulating film 31, and the block insulating film 33 that configure the upper layer columnar portion UCL1, respectively.

In the case of the cross-section shown in FIG. 6, each columnar body CL3 penetrates the insulating layer 45 and the second stacked portion 100b under the insulating layer 45 and reaches the semiconductor layer 10a of the substrate 10. The columnar body CL3 penetrates the terrace portions 70a. Lengths of the plurality of columnar bodies CL3 are generally identical in the Z direction.

As shown in FIGS. 2 and 7, a contact portion 91 is provided on the terrace portion 70a. At least one contact portion 91 is disposed on one terrace portion 70a. A plurality of contact portions 91 are provided on each staircase portion 2 to correspond to the plurality of terrace portions 70a.

Each contact portion 91 is a conductive body of a generally cylindrical column shape. The contact portion 91 is a metal body and contains, for example, tungsten or molybdenum as a main component.

The contact portion 91 extends in the insulating layer 45 in the stacking direction of the stacked body 100 and is connected to the terrace portion 70a. The contact portion 91 is surrounded by the insulating layer 45.

The contact portion 91 is connected to the upper layer interconnections, not shown. The upper layer interconnections are electrically connected to, for example, a control circuit formed on the front surface of the substrate 10. A potential of each electrode layer 70 in the memory cell array 1 is controlled through the contact portion 91 and the terrace portion 70a.

In the embodiment shown in FIG. 2, four columnar bodies CL3 are disposed around one contact portion 91 in one terrace portion 70a.

A diameter of the contact portion 91 is larger than a diameter of each columnar body CL3 in each staircase region and a diameter of each columnar portion CL1 in the memory cell array 1. The plurality of columnar portions CL1 in the memory cell array 1 are disposed more densely than the plurality of columnar bodies CL3 in the staircase region.

It is noted that the terrace portions 70a in each staircase region are formed on the electrode layers 70 from the lowermost electrode layer 70 to the uppermost electrode layer 70 in sequence in the second stacked portion 100b. Therefore, what position in the Z direction of each columnar body CL3 shown in FIGS. 6 and 7 (to be exact, in the Z direction of the lower layer columnar body LCL3 and the upper layer columnar body UCL3) through which each of the terrace portions 70a passes varies depending on at what position of the terrace portion 70a FIGS. 6 and 7 show cross-sections. For the sake of convenience, FIGS. 6 and 7 each show a cross-section at a position at which the insulating layer 45 at some thickness is present on the terrace portions 70a. Nevertheless, in a case of showing a cross-section of the uppermost terrace portion 70a, the insulating layer 45 formed on the terrace portions 70a is illustrated thinner than the insulating layer 45 shown in FIGS. 6 and 7. Furthermore, in a case of showing a cross-section of the lowermost terrace portion 70a, the insulating layer 45 formed on the terrace portions 70a is illustrated thicker than the insulating layer 45 shown in FIGS. 6 and 7.

Hole patterns are formed on a resist film, not shown, formed on the insulating layer 43 by a lithography method, the hole patterns are transferred onto the insulating layers 43 and 45 from the resist film either directly or via a mask layer, and contact holes are formed. The contact portions 91 are formed in the contact holes.

<Formation of Slit Portions>

Setting small a distance between each slit portion 60 and each columnar body CL3 to make an area of each staircase region as small as possible is likely to cause a separation portion formation slit to be deviated to a position at which the separation portion formation slit overlaps the columnar body CL3 depending on lithography accuracy for the resist film. In addition, setting small the distance between each slit portion 60 and each columnar body CL3 is likely to cause interference of part of the separation portion formation slit with the columnar body CL3.

These cases will be described hereinafter with reference to FIGS. 8 to 13.

Figure 8:
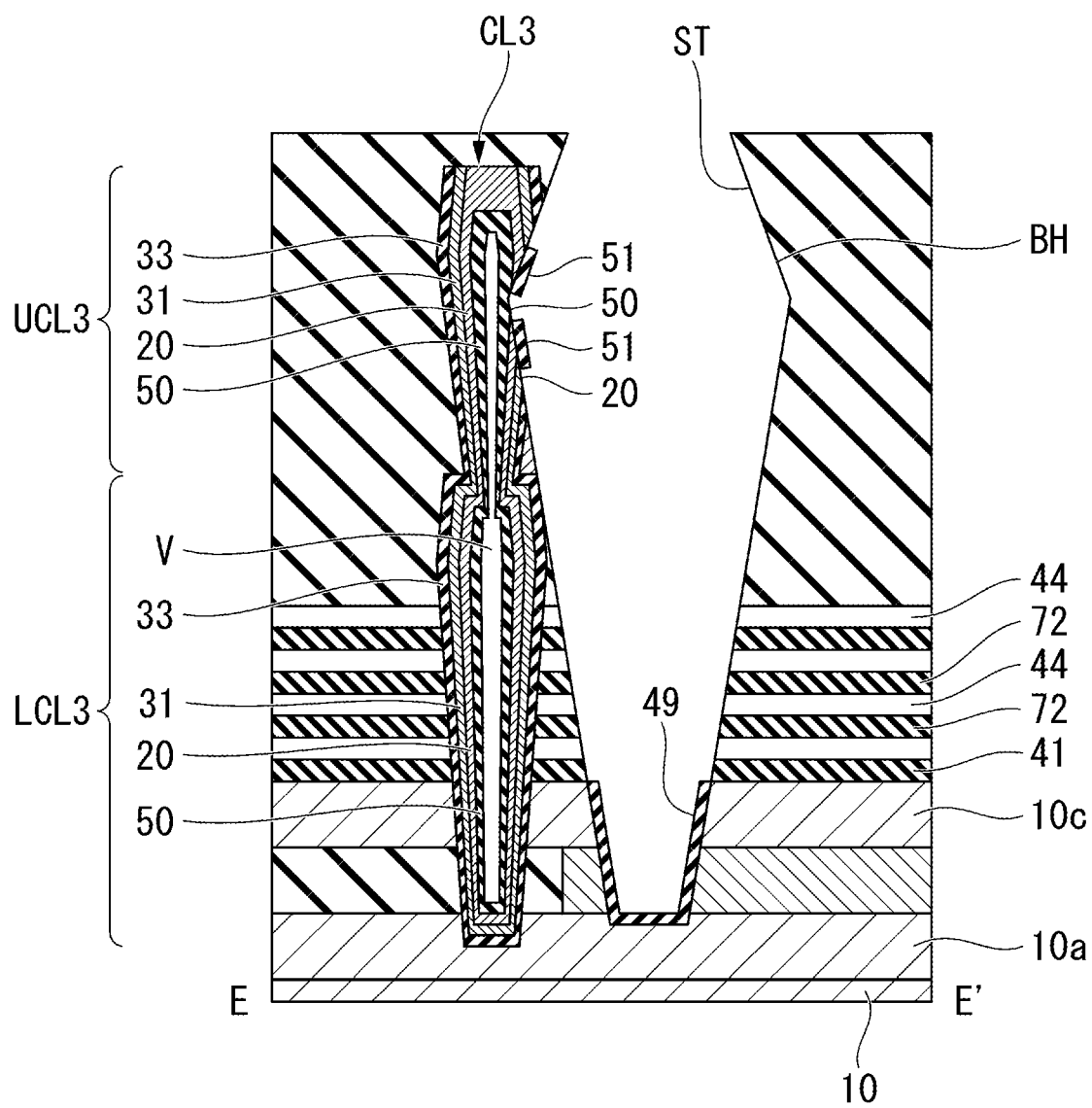
FIG. 8 is a partial cross-sectional view showing a state in which a separation portion formation slit interferes with a columnar body provided in the staircase region and having a block insulating film, a tunnel insulating film, a semiconductor body, and a core film.

FIG. 8 shows an example of a cross-section when one columnar body CL3 in the staircase region is formed at a position adjacent (position proximate) to a planned position at which the slit portion 60 is to be formed.

FIG. 8 shows a state in which a separation portion formation slit ST is formed, only sacrificial layers 73, to be described later, stacked on the electrode layers 70 are removed by etching via the slit ST with respect to the electrode layers 70 and the sacrificial layers 73, and cavities 44 are formed. In this state, a plurality of electrode layers 70 are stacked via the cavities 44. In this state, the columnar body CL3 supports a load of the stacked body of the electrode layers 70 in the staircase region.

A case where an upper portion side of the slit ST configured as shown in FIG. 8 is deformed to swell up by etching and a large-diameter portion BH is formed on the upper portion side of the slit ST is conceivable.

FIG. 8 shows a state in which this large-diameter portion BH interferes with the columnar body CL3. FIG. 8 shows a state in which the large-diameter portion BH spreads to contain part of the columnar body CL3 after etching, passes through the block insulating film 33, the tunnel insulating film 31, and the semiconductor body 20 in the upper layer columnar body UCL3, and reaches the core film 50 in the upper layer columnar body UCL3.

In the present embodiment, the upper layer columnar body UCL3 is configured with the void portion V, the core film 50, the semiconductor body 20, the tunnel insulating film 31, and the block insulating film 33. Owing to this, even if one of these elements is exposed into the slit ST after formation of the slit ST, a problem of interconnection leakage does not occur in processes to be performed subsequently. It is noted that circumstances for no occurrence of the problem of the interconnection leakage will be described hereinafter in association with the manufacturing method.

The columnar portion CL1 described previously with reference to FIGS. 5A, 5B, and the like has the semiconductor body 20, the tunnel insulating film 31, the charge storage film 32, and the block insulating film 33, and the columnar portion CL1 and the electrode layer 70 configure one memory cell MC. The memory cell MC assumes the vertical transistor structure in which the electrode layer 70 surrounds the semiconductor body 20 via a plurality of films.

In processes of manufacturing the memory cell array 1, a replacement process for replacing, after removal of the sacrificial layers 73, part of the cavities 44 generated in the cell array region by a metal to form the electrode layers 70 that are shown in FIG. 5A and each function as the control gate in part of the cavities 44.

The metal layers such as the tungsten layers containing tungsten are used to form the electrode layers 70. When the slit ST described above interferes with part of the upper layer columnar body UCL3 in this replacement process, a problem possibly occurs depending on a structure of the upper layer columnar body UCL3.

Figure 9:
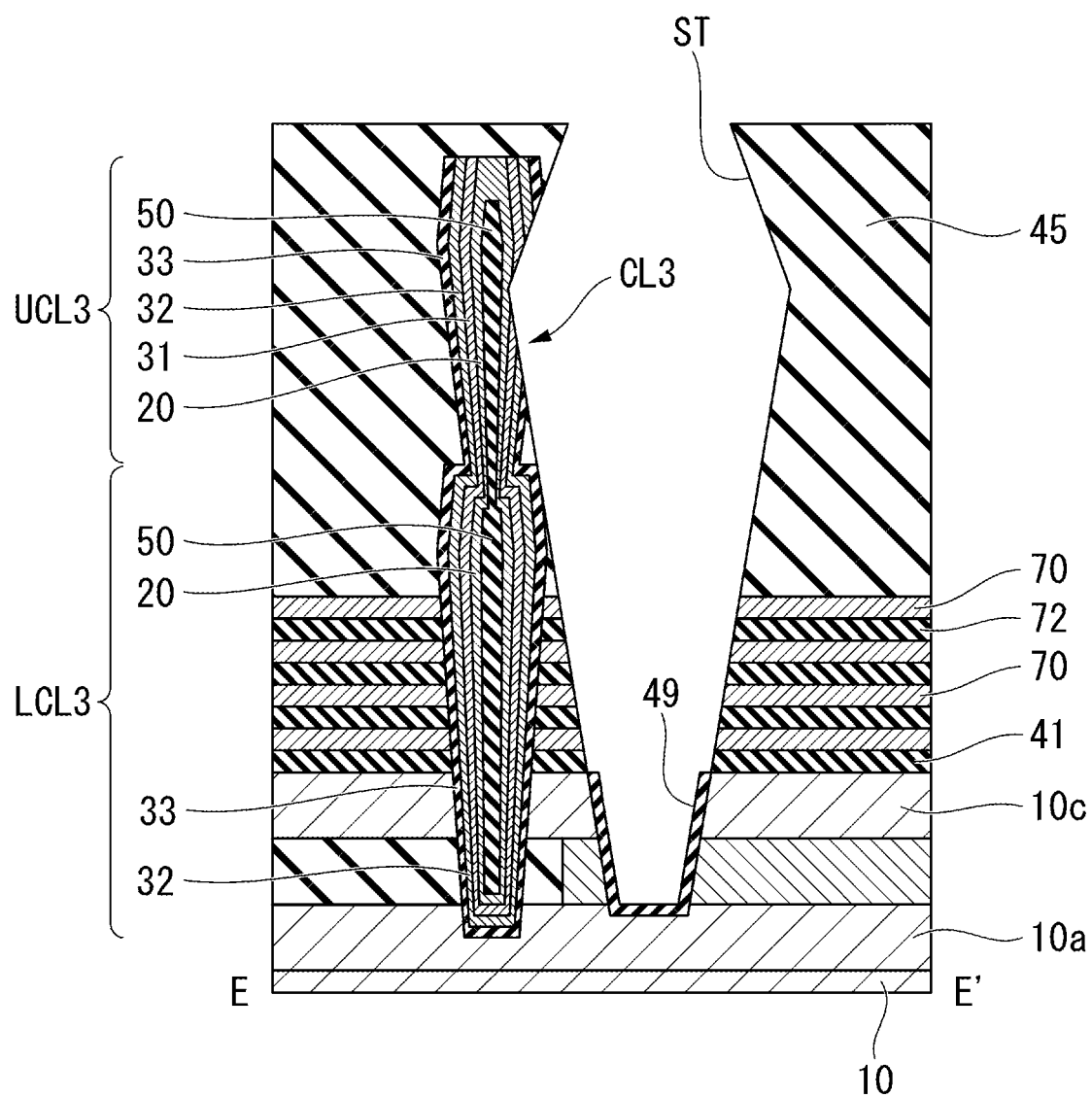
FIG. 9 is a partial cross-sectional view showing a state in which the separation portion formation slit interferes with the columnar body provided in the staircase region and having the block insulating film, a charge storage film, the tunnel insulating film, the semiconductor body, and the core film.

As shown in, for example, FIG. 9, the structure of the upper layer columnar body UCL3 in which the core film 50, the semiconductor body 20, the tunnel insulating film 31, the charge storage film 32, and the block insulating film 33 are disposed in sequence from the shaft center side to the outer periphery side of the upper layer columnar body UCL3 will be temporarily considered.

With configurations shown in FIG. 9, the charge storage film 32 is exposed into the slit ST. In this case, there is a risk of replacement of part of the charge storage film 32 by the metal layers such as the tungsten layers in the replacement process described above.

When part of the charge storage film 32 is replaced by the metal layers, there is a risk of triggering interconnection leakage among a plurality of electrode layers 70 stacked around the lower layer columnar body LCL3 since the plurality of electrode layers 70 are stacked around the lower layer columnar body LCL3 joined to a lower portion of the upper layer columnar body UCL3.

In this respect, if the upper layer columnar body UCL3 is the upper layer columnar body UCL3 in which the core film 50, the semiconductor body 20, the tunnel insulating film 31, and the block insulating film 33 are disposed in sequence as shown in FIG. 8, the replacement by the metal layers does not occur even in the replacement process since the charge storage film 32 is excluded. That is, in a case of forming an oxide film 49 around a bottom portion of the slit ST by performing selective oxidation before the replacement process, it is possible to prevent replacement of the semiconductor body 20 exposed into the slit ST by the metal layers in the subsequent replacement process by oxidizing the semiconductor body 20 and forming an oxide layer 51.

According to at least one embodiment, overlap between a position of the slit ST and a position of the columnar body CL3, that is, contact between the slit portions, i.e., separation portion 60 and the columnar body CL3 is allowable. This makes it possible to reduce the distance between the slit portion, i.e., separation portion 60 and the columnar body CL3 and to reduce an area of one terrace portion 70*a* where the columnar bodies CL3 are disposed. This can contribute to reducing a chip size of the semiconductor storage device configured with the memory cells MC.

Next, other effects obtained when each columnar body CL3 is configured with the core film 50, the semiconductor body 20, the tunnel insulating film 31, and the block insulating film 33 will be described.

FIGS. 10 to 14 are partial cross-sectional views illustrating the columnar body CL3 in the staircase region and the columnar portion CL1 in the cell array region in parallel on the assumption that the columnar body CL3 and the columnar portion CL1 are disposed adjacently for the sake of convenience. Furthermore, FIGS. 10 to 13 show the first stacked portion 100*a* and the second stacked portion 100*b* in a stage before the replacement process described above; thus, FIGS. 10 to 13 show a state in which the electrode layers 70 and the sacrificial layers 73 are stacked.

Figure 10:
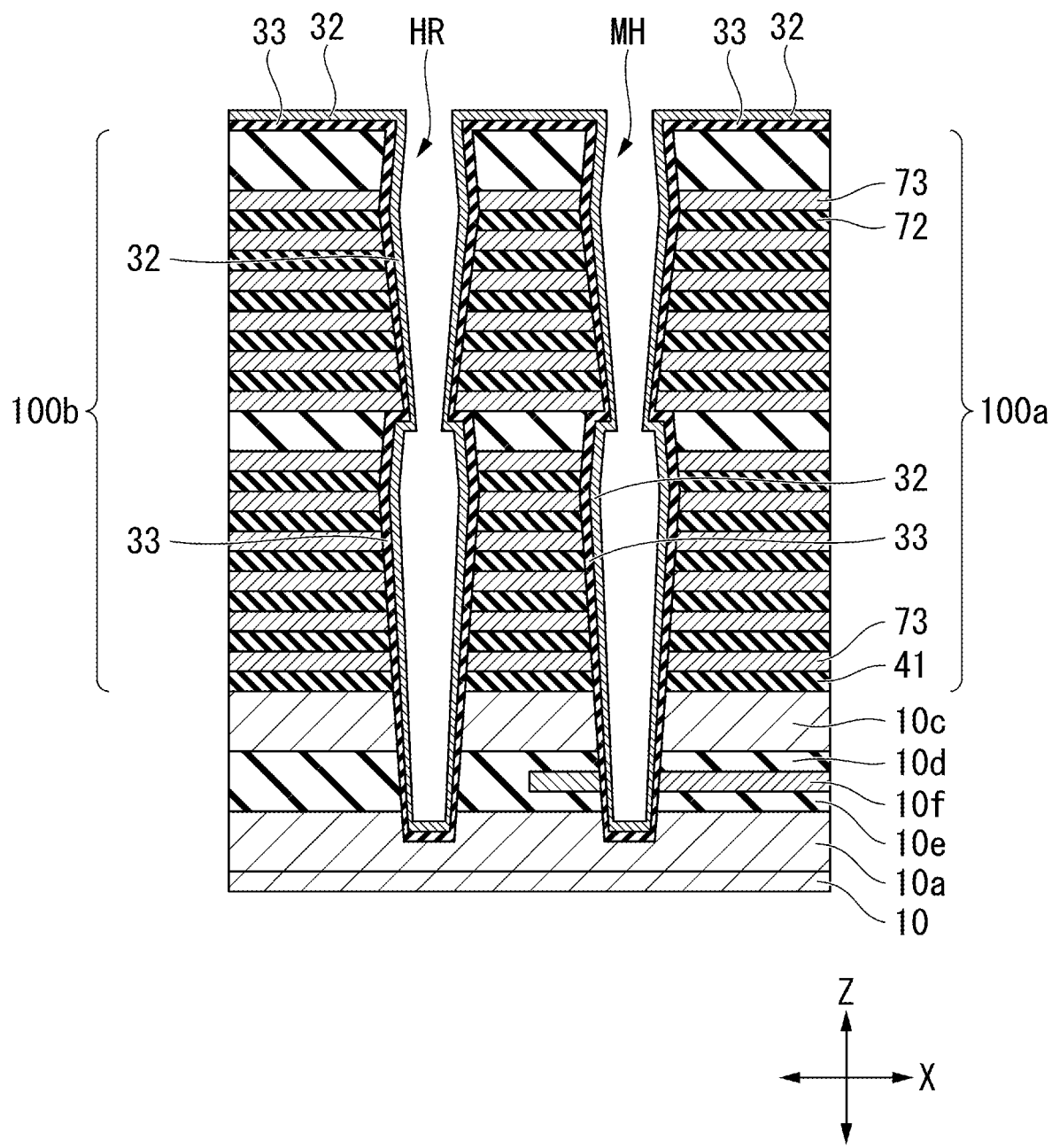
FIG. 10 is a partial cross-sectional view showing a state in which the block insulating film and the charge storage film are formed in a staircase region hole for forming the columnar body provided in the staircase region of electrode layers and in a memory hole for forming a columnar portion provided in a memory cell array region.

Moreover, a state shown in a right half of FIG. 10 indicates a stage before forming the source line 10*b* shown in FIG. 4 in the cell array region. Owing to this, an insulating layer 10*f* formed from SiN in a state of being buried in upper and lower thin semiconductor layers 10*d* and 10*e* is formed in a region where the source line 10*b* is to be formed.

The first stacked portion 100*a* in the cell array region has a repetitive stacked structure of the electrode layers 70 and the insulating layers 72 from a bottom portion side to an upper portion side of the first stacked portion 100*a*. In the second stacked portion 100*b* in the staircase region, by contrast, the thickness of the insulating layer 45 above the terrace portions 70*a* changes depending on which of the plurality of terrace portions 70*a* formed in a staircase fashion is assumed. Owing to this, cross-sectional structures shown in FIGS. 10 to 14 are illustrated on the assumption of the columnar body CL3 provided in the terrace portion 70*a* at an uppermost position.

As shown in FIG. 14, the columnar portion CL1 is configured such that the upper layer columnar portion UCL1 is stacked on the lower layer columnar portion LCL1, and the columnar body CL3 is configured such that the upper layer columnar body UCL3 is stacked on the lower layer columnar body LCL3.

As shown in FIG. 10, a memory hole MH for forming the lower layer columnar portion LCL1 and the upper layer columnar portion UCL1 is formed in the first stacked portion 100*a*. In addition, a staircase region hole HR for forming the lower layer columnar body LCL3 and the upper layer columnar body UCL3 is formed in the second stacked portion 100b.

As shown in FIG. 10, the block insulating film 33 and the charge storage film 32 are formed on inner surfaces of the memory hole MH and the staircase region hole HR.

Figure 11:
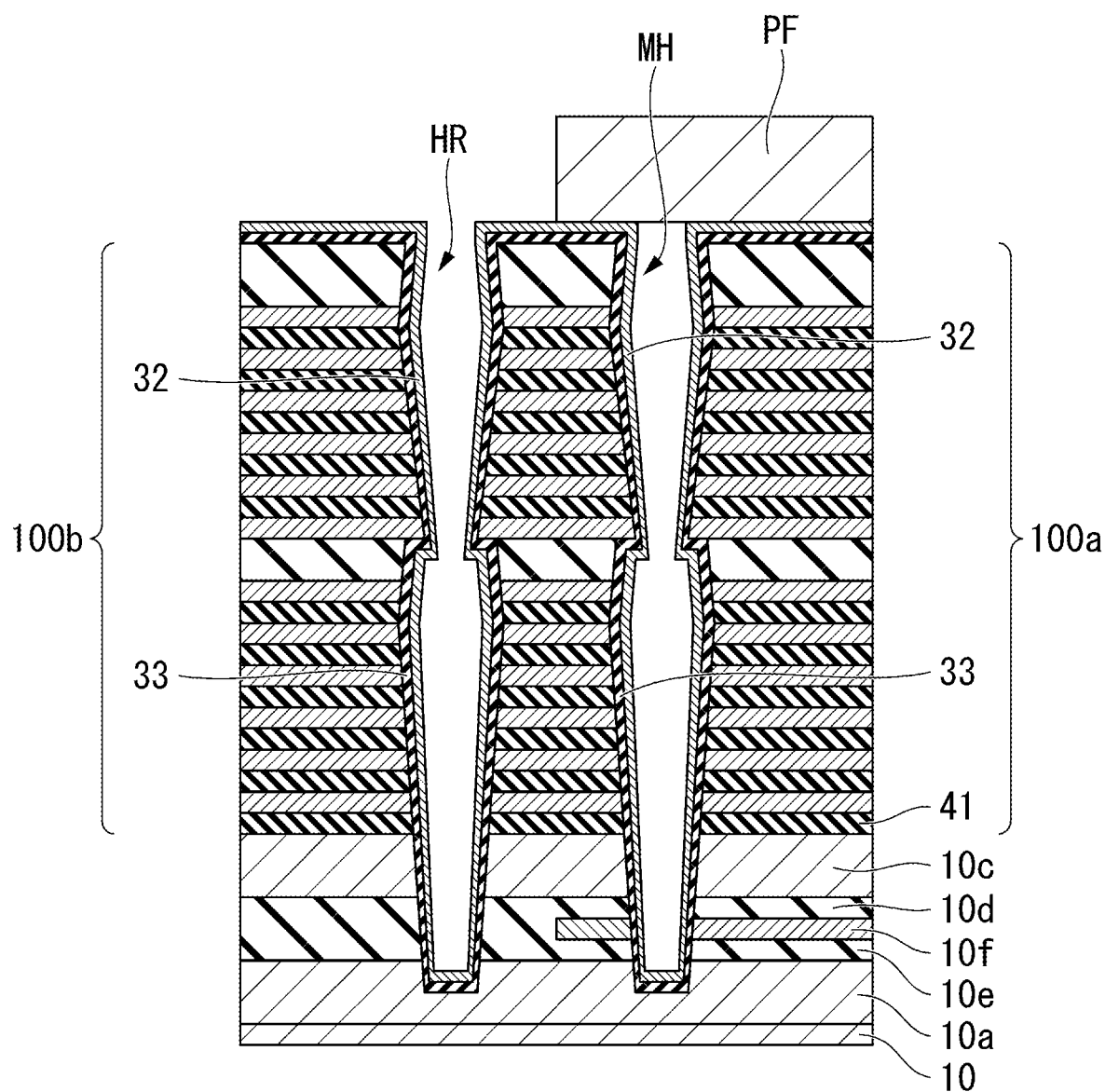
FIG. 11 is a partial cross-sectional view showing a state in which an opening of the memory hole is covered with a patterning film.
Figure 12:
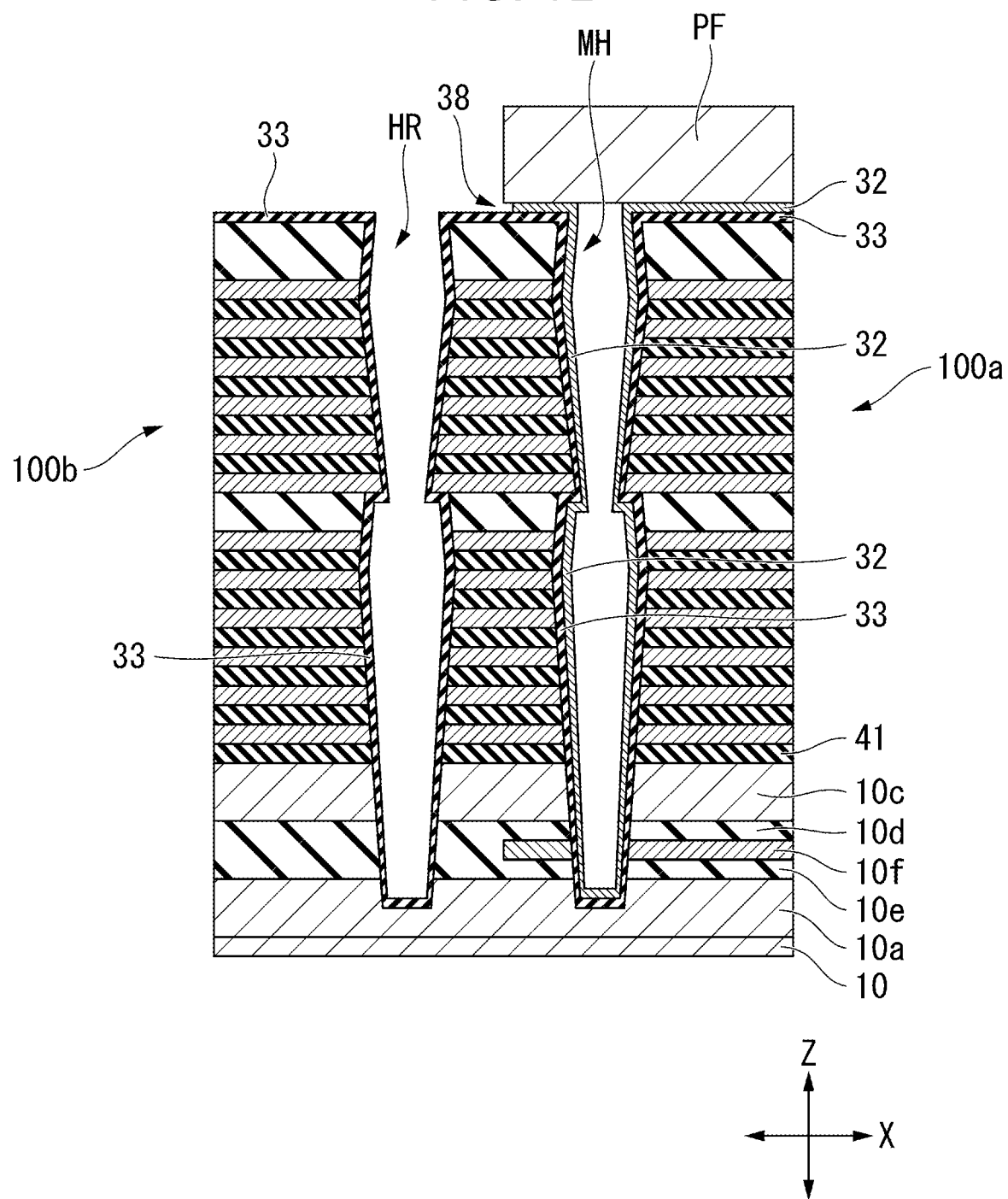
FIG. 12 is a partial cross-sectional view showing a minute level difference portion formed between the opening of the memory hole and an opening of the staircase region hole in a state of removing the charge storage film within the staircase region hole.

Next, as shown in FIG. 11, an opening of the memory hole MH is covered with a patterning film PF. Next, as shown in FIG. 12, the charge storage film 32 in regions that are not covered with the patterning film PF is removed by an approach such as chemical etching or ion beam etching.

Figure 13:
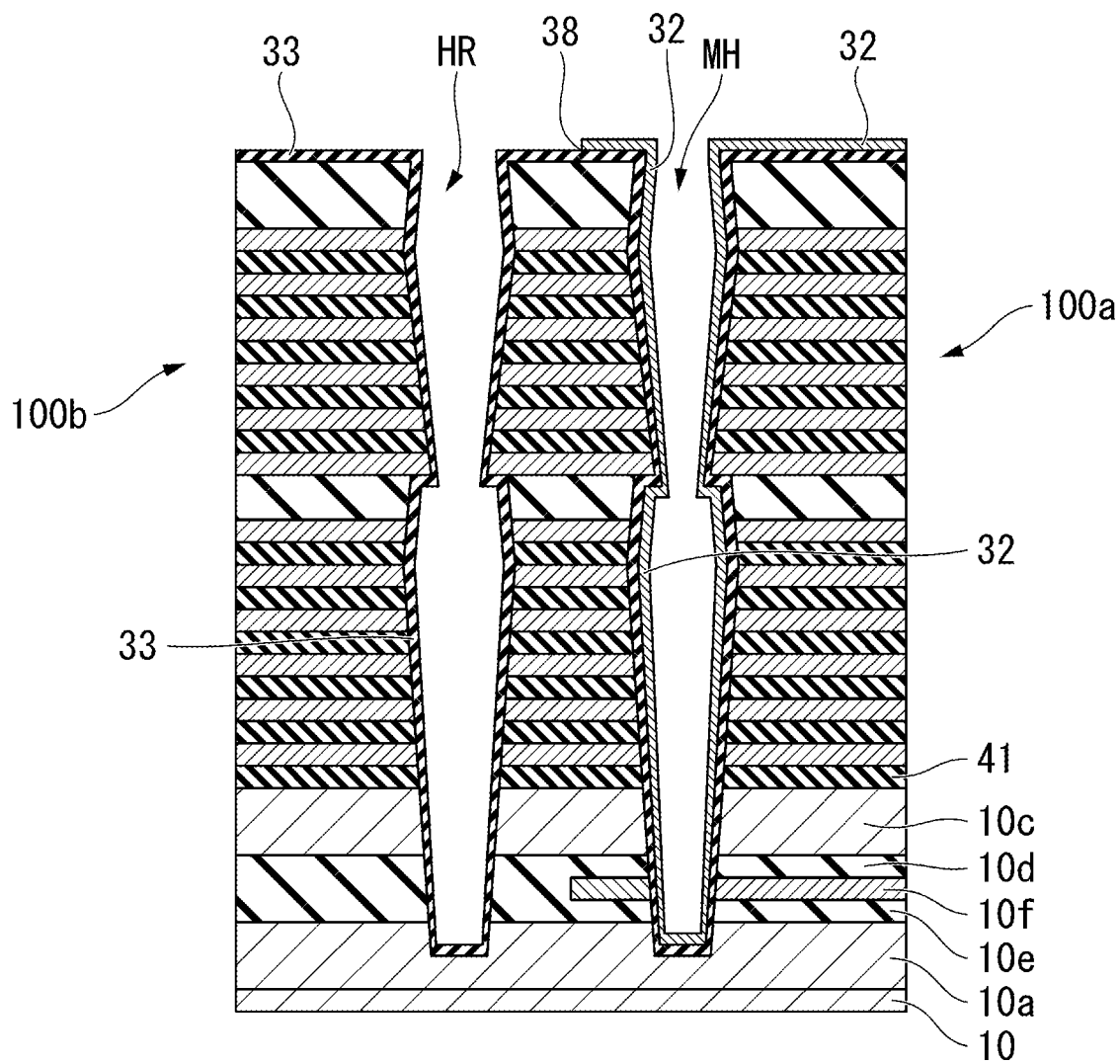
FIG. 13 is a partial cross-sectional view showing a state of removing the patterning film.

Next, as shown in FIG. 13, the patterning film PF is removed and the opening of the memory hole MH and an opening of the staircase region hole HR are exposed. A minute level difference portion 38 as thick as the charge storage film 32 is generated herein between the uppermost layer of the first stacked portion 100a and the uppermost layer of the second stacked portion 100b.

Next, as shown in FIG. 14, configurations with the columnar portion CL1 and the columnar body CL3 can be obtained by forming the tunnel insulating film 31, the semiconductor body 20, and the core film 50 in sequence. That is, the columnar portion CL1 having the lower layer columnar portion LCL1 and the upper layer columnar portion UCL1 can be formed in the memory hole MH. In addition, the columnar body CL3 having the lower layer columnar body LCL3 and the upper layer columnar body UCL3 can be formed in the staircase region hole HR.

Next, a case of configuring the columnar body CL3 in each staircase region from silicon oxide will be described on the assumption of cross-sections similar to those shown in FIGS. 10 to 14.

FIGS. 15 to 18 are partial cross-sectional views illustrating the columnar body CL3 in the staircase region and the columnar portion CL1 in the cell array region in parallel on the assumption that the columnar body CL3 and the columnar portion CL1 are disposed adjacently for the sake of convenience.

Figure 15:
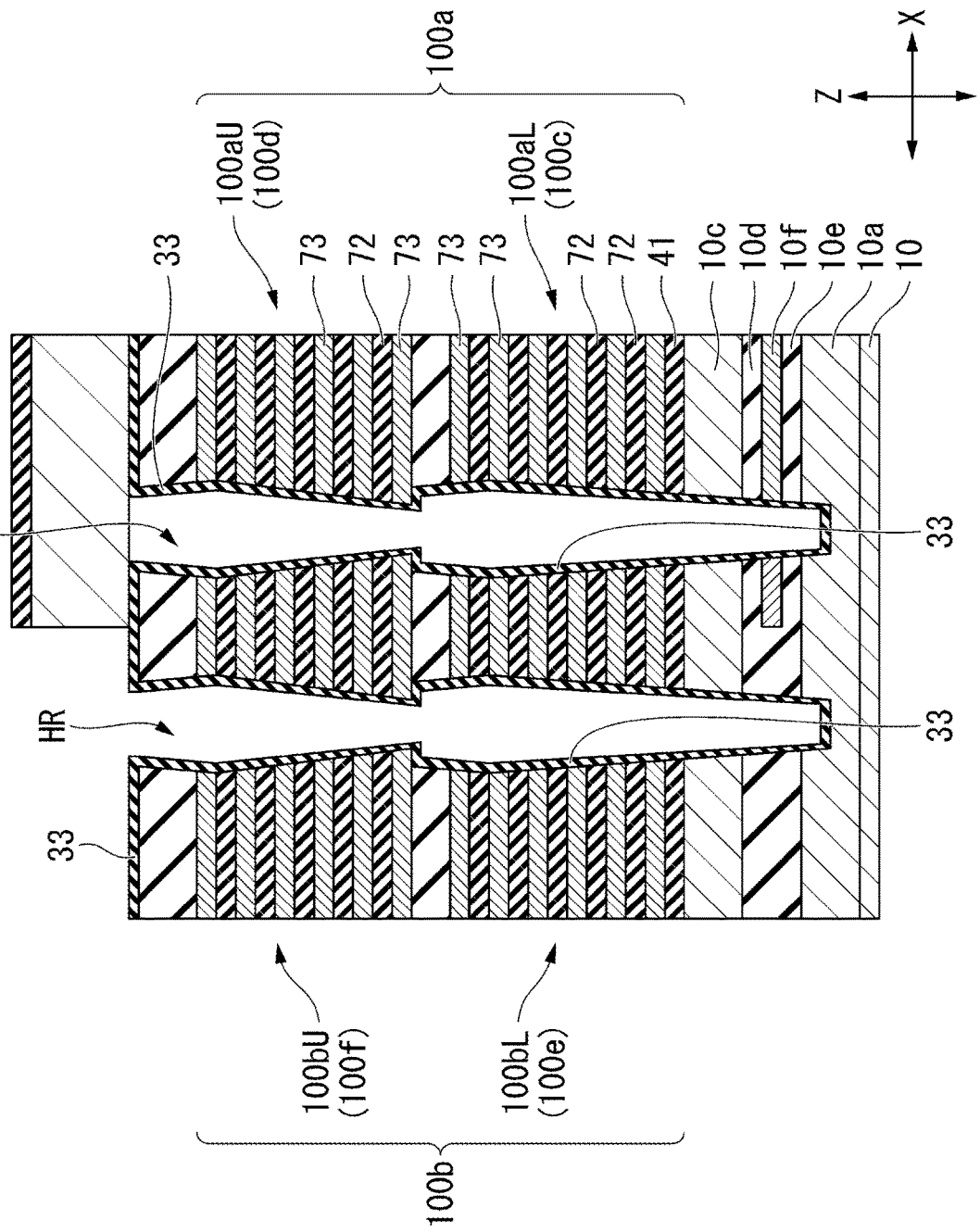
FIG. 15 is a partial cross-sectional view showing a state in which the opening of the memory hole is covered with the patterning film and the staircase region hole is opened after forming the block insulating film in the staircase region hole and the memory hole.

As shown in FIG. 15, the block insulating film 33 is formed on the inner surfaces of the memory hole MH and the staircase region hole HR. Furthermore, the opening of the memory hole MH is covered with the patterning film PF.

Figure 16:
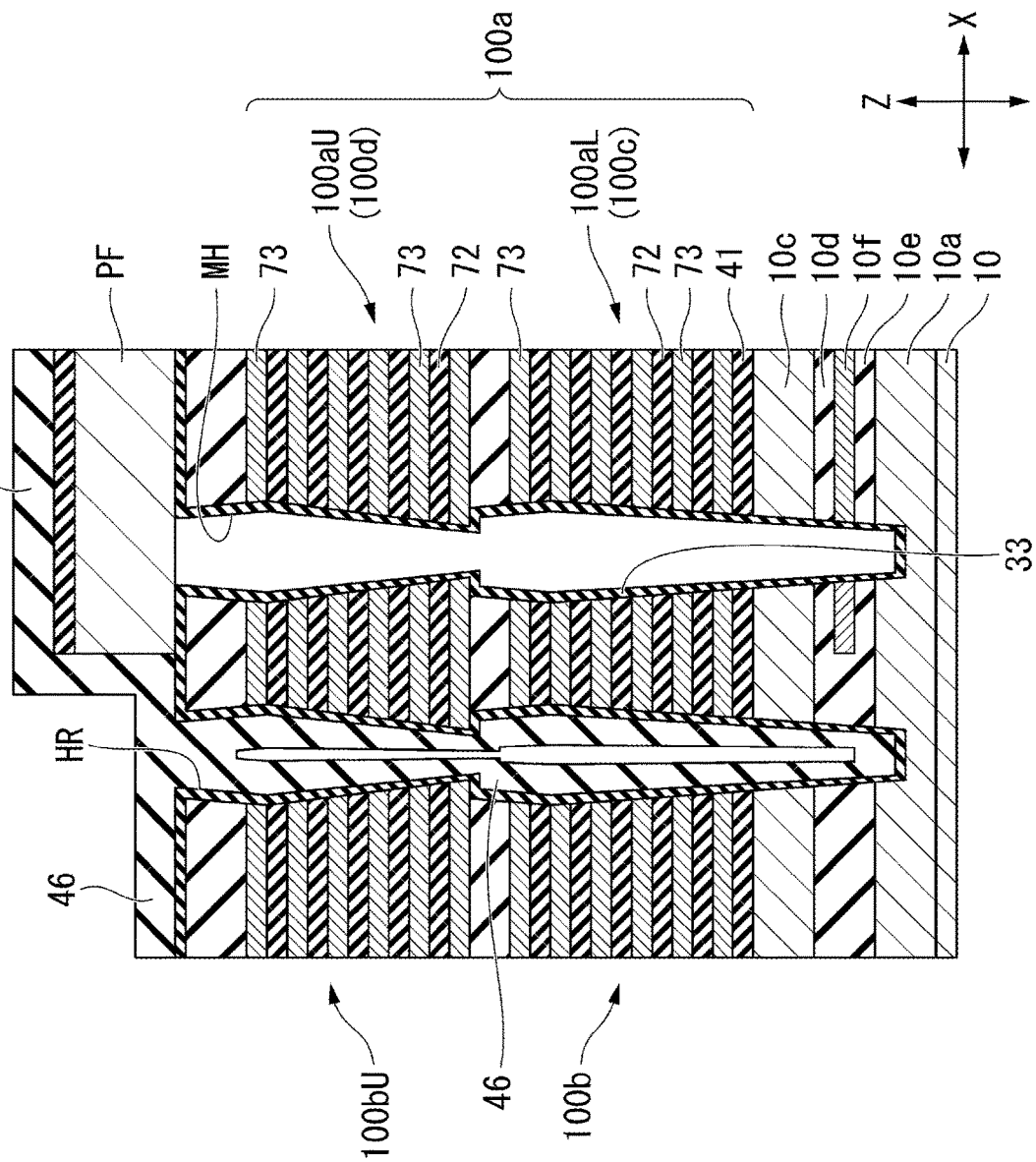
FIG. 16 is a partial cross-sectional view showing a state in which silicon oxide is filled into the opened staircase region hole.

Next, as shown in FIG. 16, silicon oxide is filled into the staircase region hole HR. Upon forming a film from silicon oxide in amounts to the extent of burying most of the staircase region hole HR, a silicon oxide layer 46 at quite a large thickness adheres onto the second stacked portion 100b in the staircase region and onto the patterning film PF.

Figure 17:
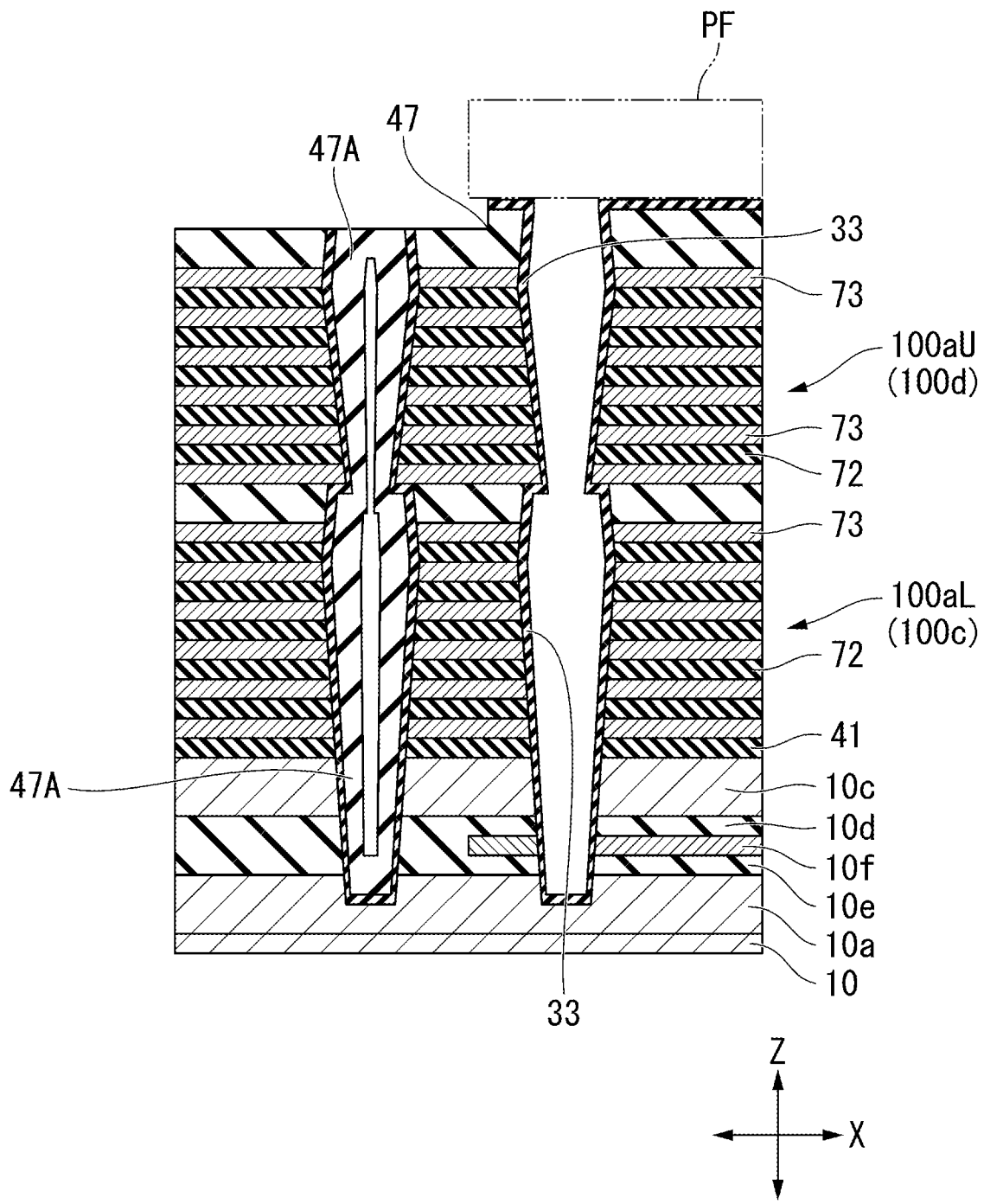
FIG. 17 is a partial cross-sectional view showing a large level difference portion generated in a stage of removing the patterning film.

Next, as shown in FIG. 17, etch back is performed by wet etching. The silicon oxide layer 46 on the second stacked portion 100b in the staircase region is removed by the etch back, and the patterning film PF is then removed. It is noted that a level difference portion 47 is naturally generated between an uppermost layer in the region covered with the patterning film PF and an uppermost layer in the regions that are not covered with the patterning film PF as a result of the etch back by the wet etching.

Figure 18:
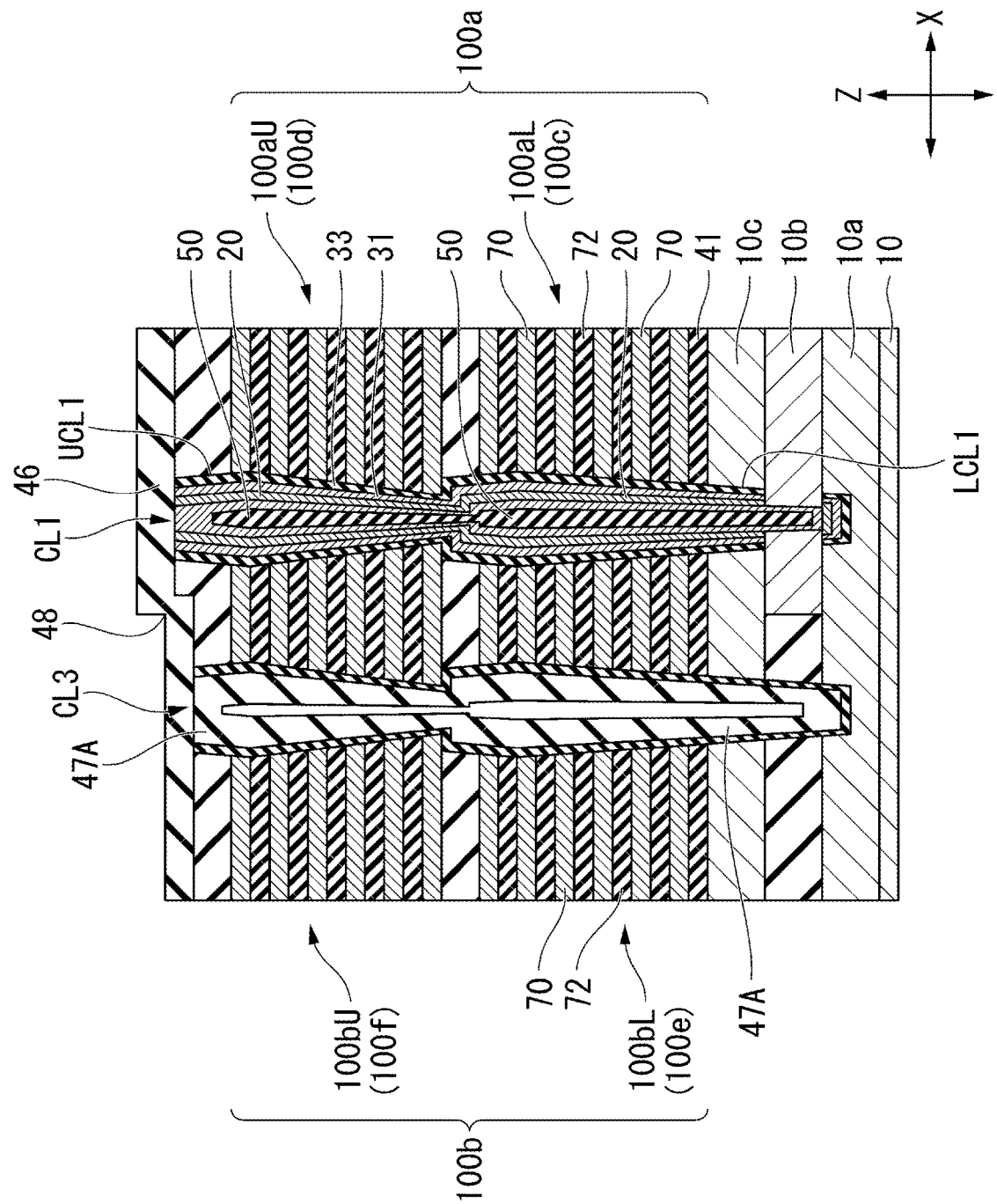
FIG. 18 is a partial cross-sectional view showing a state in which the columnar portion having the block insulating film, the charge storage film, the tunnel insulating film, the semiconductor body, and the core film is formed in the memory hole.

Subsequently, as shown in FIG. 18, the columnar portion CL1 having the lower layer columnar portion LCL1 and the upper layer columnar portion UCL1 is formed in the memory hole MH. To form the columnar portion CL1, the lower layer columnar portion LCL1, and the upper layer columnar portion UCL1, the charge storage film 32, the tunnel insulating film 31, the semiconductor body 20, the core film 50, and the like may be formed in sequence. FIG. 18 shows a state after the replacement process described previously is performed and the sacrificial layers 73 are replaced by the insulating layers 72.

Adopting a structure shown in FIG. 18 makes it possible to form a columnar body 47A by filling silicon oxide into the staircase region hole HR. However, the columnar body 47A formed from silicon oxide is lower in strength than the columnar body CL3 formed by the method described previously and shown in FIG. 14; thus, the plurality of electrode layers 70 in the staircase region tend to be distorted and sunk portions are generated in the staircase region. For example, in the case of removing the sacrificial layers 73, forming a plurality of cavities 44 as shown in FIG. 8, and supporting the plurality of remaining insulating layers 72, then the columnar body 47A is distorted by weights of the plurality of insulating layers 72, and sunk portions tend to be generated in stacked materials of the insulating layers 72.

These factors tend to generate a large level difference portion 48 between the uppermost layer of the first stacked portion 100a in the cell array region and the uppermost layer of the second stacked portion 100b in the staircase region in the structure shown in FIG. 18. Furthermore, the level difference portion 47 generated at the time of the etch back previously performed is also added to this level difference 48; thus, in the structure shown in FIG. 18, the level difference portion 48 generated between the uppermost layer of the first stacked portion 100a in the cell array region and the uppermost layer of the second stacked portion 100b in the staircase region grows large.

This level difference portion 48 is likely to result in a wide range of irregularities in a case of planarization of an upper surface by performing chemical mechanical polishing (CMP) or the like after forming various films in later processes, and to cause a reduction in working accuracy.

By contrast to the case of FIGS. 15 to 18, the minute level difference portion 38 is generated between the uppermost layer of the first stacked portion 100a in the cell array region and the uppermost layer of the second stacked portion 100b in the staircase region even in the structure by the manufacturing method described with reference to FIGS. 10 to 14, as shown in FIGS. 12 and 13. However, the minute level difference portion 38 corresponds to a level difference portion by as much as removal of only the charge storage film 32, so that the minute level difference portion 38 is far smaller than the level difference portion 48 described above.

Therefore, in the structure configured with the columnar body CL3 described with reference to FIGS. 8 and 14, it is possible to diminish the level difference portion between the uppermost layer of the first stacked portion 100a in the cell array region and the uppermost layer of the second stacked portion 100b in the staircase region. Owing to this, even a case of forming other interconnection layers on the first stacked portion 100a in the cell array region and on the second stacked portion 100b in the staircase region does not adversely affect the planarization of each layer and contributes to the planarization of the uppermost layers.

Figure 19:
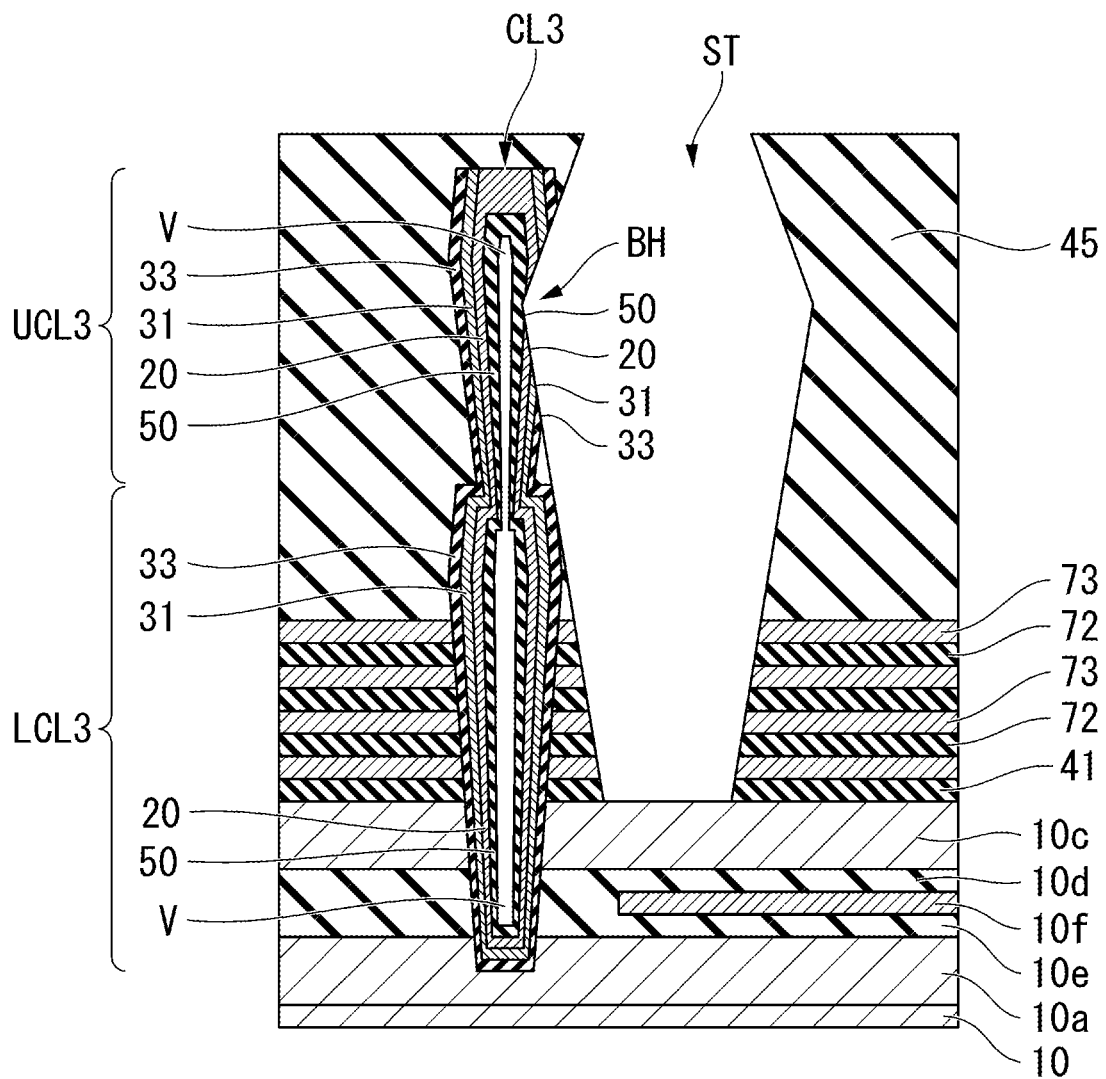
FIG. 19 is a partial cross-sectional view showing a state in which the separation portion formation slit is formed in the vicinity of the columnar body by ion beam etching.

FIG. 19 shows an example of a cross-section when the columnar body CL3 in the staircase portion is formed at a position adjacent (position proximate) to a planned position at which the slit portion 60 is to be formed.

FIG. 19 shows a state in which the separation portion formation slit ST is formed down to a surface position of the semiconductor layer 10c by reactive ion etching (RIE). FIG. 19 shows the cross-section of a lower layer region of the staircase region.

In this state, it is considered that a state in which the large-diameter portion BH of the slit ST spreads to contain part of the columnar body CL3, passes through the block insulating film 33, the tunnel insulating film 31, and the semiconductor body 20 in the upper layer columnar body UCL3, and reaches the core film 50 in the upper layer columnar body UCL3 is often generated.

Even in the case of generating this structure, the films in the slit ST are protected by oxidation since a process for oxidizing a silicon layer is performed as a post-process in the case of forming the slit portions 60.

As a result, similarly to the case described with reference to the structure shown in FIG. 8, the problem of replacing the part exposed into the slit ST by the metal layers does not occur.

Moreover, similarly to the case described with reference to the structure shown in FIG. 8, problems of the sunk portions and the large level difference portion occurring in the structure shown in FIGS. 17 and 18 do not occur in the structure of FIG. 19.

Figure 20:
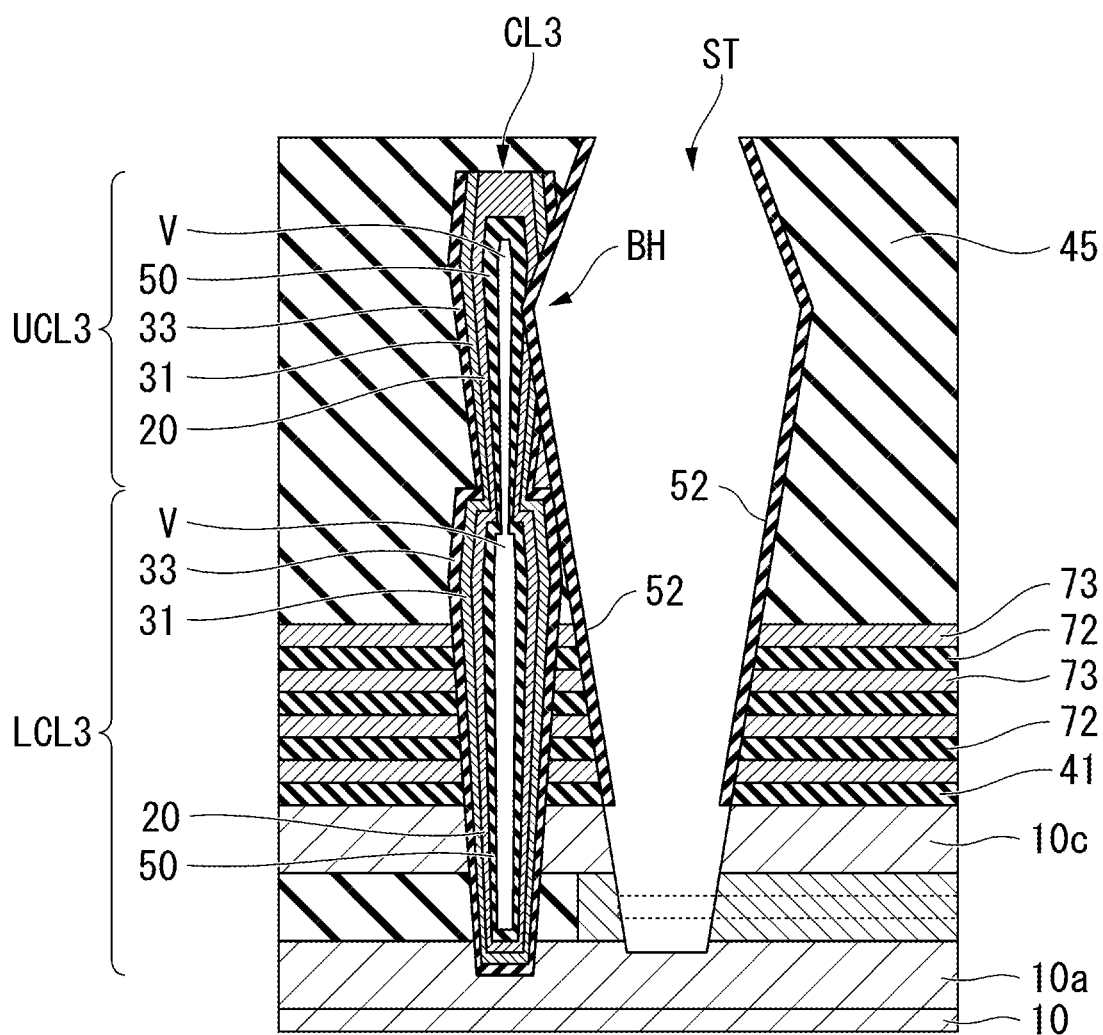
FIG. 20 is a partial cross-sectional view showing a state in which the slit that reaches an active region interferes with the columnar body in the staircase region in a case of forming the slit.

FIG. 20 shows another example of the cross-section in the case where the columnar body CL3 in the staircase region is formed at the position adjacent to the planned position at which the slit portion 60 is to be formed.

FIG. 20 shows a state in which the separation portion formation slit ST is formed down to an inner side of the semiconductor layer 10a by etching after formation of the separation portion formation slit ST by the reactive ion etching. FIG. 20 shows a cross-section of the lower layer region of the staircase region.

In this state, it is considered that the state in which the large-diameter portion BH of the slit ST spreads to contain part of the columnar body CL3, passes through the block insulating film 33, the tunnel insulating film 31, and the semiconductor body 20 in the upper layer columnar body UCL3, and reaches the core film 50 in the upper layer columnar body UCL3 is often generated.

Even in the case of generating this structure, the film exposed into the slit ST can be protected since an insulating layer 52 is formed on an inner surface of the slit ST in a post-process in the case of forming the slit portions 60. This insulating film 52 protects the stacked film possibly exposed to the inner surface side of the slit ST in a case of performing a process for forming the source line 10c.

As a result, similarly to the case described with reference to the structure shown in FIG. 8, the problem of replacing the part exposed into the slit ST by the metal layers does not occur.

Moreover, similarly to the case described with reference to the structure shown in FIG. 8, the problems of the sunk portions and the large level difference portion occurring in the structure shown in FIGS. 17 and 18 do not occur in the structure of FIG. 20.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a substrate layer;
a stacked body disposed on the substrate layer and including a plurality of electrode layers stacked in a first direction via insulators, the stacked body including stepped portions in which the plurality of electrode layers include a plurality of terrace portions forming level difference portions and the plurality of terrace portions aligned in a staircase pattern;
columnar portions, each columnar portion including a semiconductor body extending within the stacked body in the first direction, and a charge storage portion disposed between the semiconductor body and the electrode layers;
an insulating layer disposed on the plurality of terrace portions;
a plurality of columnar bodies extending in the first direction and disposed within the insulating layer; and
slit portions extending in the first direction and a second direction crossing the first direction, the slit portions disposed in the stacked body at predetermined intervals in a third direction crossing the first direction and the second direction, the slit portions splitting the stacked body into a plurality of string units, wherein
each of the columnar bodies adjacent to each of the slit portions has a core film, the semiconductor body, a tunnel insulating film, and a block insulating film formed in sequence from a shaft center side to an outer periphery side of the columnar bodies, without having the charge storage portion between the tunnel insulating film and the block insulating film,
without having the charge storage portion between each of the columnar bodies and each of the plurality of electrode layers.

2. The semiconductor storage device according to claim 1, wherein
the columnar portions each include the core film, the semiconductor body, the tunnel insulating film, the charge storage portion, and the block insulating film formed in sequence from a shaft center side to an outer periphery side of the columnar portion.

3. The semiconductor storage device according to claim 1, wherein
each of the string units includes a plurality of the columnar bodies in each of the terrace portions in the stacked body, and includes a plurality of the columnar portions in portions other than the terrace portions in the stacked body.

4. The semiconductor storage device according to claim 1, wherein
the block insulating film has a first block film and a second block film.

5. The semiconductor storage device according to claim 4, wherein the second block film is a metal oxide film higher in dielectric constant than a material of the first block film.

6. The semiconductor storage device according to claim 1, wherein
the stacked body has a lower stacked body and an upper stacked body, the plurality of electrode layers and a plurality of insulators being alternately stacked in the lower stacked body and in the upper stacked body.

7. The semiconductor storage device according to claim 6, wherein
the columnar portions each have a lower layer columnar portion disposed in the lower stacked body and an upper layer columnar portion disposed in the upper stacked body.

8. The semiconductor storage device according to claim 6, wherein the columnar bodies each have a lower layer columnar body disposed in the lower stacked body and an upper layer columnar body disposed in the upper stacked body.

9. The semiconductor storage device according to claim 6, wherein the upper stacked body is directly above the lower stacked body.

10. The semiconductor storage device according to claim 1, wherein the substrate includes a semiconductor layer.

11. The semiconductor storage device according to claim 1, wherein the semiconductor storage device is a three dimensional memory device.

12. The semiconductor storage device according to claim 1, wherein the electrode layers include at least one of tungsten or molybdenum.

13. The semiconductor storage device according to claim 1, wherein the insulators include silicon oxide as a main component.

14. The semiconductor storage device according to claim 1, wherein the columnar portions are arranged as part of a staggered arrangement or a square grid pattern.

15. The semiconductor storage device according to claim 1, further comprising one or more bit lines connected to the plurality of columnar bodies.

16. The semiconductor storage device according to claim 1, wherein the slit portions are filled with an insulating film.

* * * * *